(12) United States Patent
Yu et al.

(10) Patent No.: US 10,868,140 B2
(45) Date of Patent: Dec. 15, 2020

(54) GAP-FILLING GERMANIUM THROUGH SELECTIVE BOTTOM-UP GROWTH

(71) Applicant: Taiwan Semiconductor Manufacturing Company, Ltd., Hsinchu (TW)

(72) Inventors: De-Wei Yu, Ping-tung (TW); Chien-Hao Chen, Chuangwei Township (TW); Ziwei Fang, Hsinchu (TW); Yee-Chia Yeo, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/655,532

(22) Filed: Oct. 17, 2019

(65) Prior Publication Data
US 2020/0052089 A1    Feb. 13, 2020

Related U.S. Application Data

(63) Continuation of application No. 15/800,471, filed on Nov. 1, 2017, now Pat. No. 10,468,501.

(60) Provisional application No. 62/565,595, filed on Sep. 29, 2017.

(51) Int. Cl.
*H01L 29/66* (2006.01)
*H01L 21/8234* (2006.01)
*H01L 21/8238* (2006.01)

(52) U.S. Cl.
CPC ........... *H01L 29/66545* (2013.01); *H01L 21/823431* (2013.01); *H01L 21/823437* (2013.01); *H01L 21/823821* (2013.01); *H01L 29/66795* (2013.01)

(58) Field of Classification Search
CPC ....... H01L 21/823821; H01L 21/02532; H01L 21/823431; H01L 29/0649; H01L 29/66545
See application file for complete search history.

(56) References Cited

U.S. PATENT DOCUMENTS

| 4,847,214 | A | 7/1989 | Robb et al. |
| 5,143,862 | A * | 9/1992 | Moslehi ............ H01L 21/76248 257/E21.56 |
| 7,439,155 | B2 * | 10/2008 | Mouli ............... H01L 27/14601 257/E21.131 |
| 9,379,243 | B1 | 6/2016 | Hashemi et al. |

(Continued)

FOREIGN PATENT DOCUMENTS

| CN | 103295963 A | 9/2013 |
| KR | 20130100666 A | 9/2013 |

(Continued)

*Primary Examiner* — Zandra V Smith
*Assistant Examiner* — John M Parker
(74) *Attorney, Agent, or Firm* — Slater Matsil, LLP

(57) ABSTRACT

A method includes depositing a silicon layer on a plurality of strips. The silicon layer is etched back to remove top portions of the silicon layer, and to expose some portions of the plurality of strips. Some bottom portions of the silicon layer at bottoms of trenches between the plurality of strips remain after the etching back. A germanium layer is selectively grown from remaining portions of the silicon layer, and exposed portions of the plurality of strips remain exposed after the germanium layer is selectively grown.

20 Claims, 26 Drawing Sheets

(56) References Cited

U.S. PATENT DOCUMENTS

| | | | |
|---|---|---|---|
| 2005/0077553 A1* | 4/2005 | Kim | H01L 21/823412 257/288 |
| 2008/0169534 A1* | 7/2008 | Dip | H01L 21/02381 257/622 |
| 2011/0097889 A1* | 4/2011 | Yuan | H01L 21/76224 438/595 |
| 2011/0250738 A1 | 10/2011 | Kang et al. | |
| 2013/0228862 A1 | 9/2013 | Lee et al. | |
| 2014/0077288 A1 | 3/2014 | Yamamoto et al. | |
| 2014/0138745 A1 | 5/2014 | Shin et al. | |
| 2014/0151814 A1* | 6/2014 | Giles | H01L 21/02532 257/369 |
| 2014/0227858 A1 | 8/2014 | Shen et al. | |
| 2015/0214051 A1 | 7/2015 | Kim et al. | |
| 2015/0295090 A1 | 10/2015 | Tsai et al. | |
| 2016/0190019 A1 | 6/2016 | Yang et al. | |
| 2016/0307842 A1 | 10/2016 | Baek et al. | |
| 2017/0200744 A1* | 7/2017 | Giles | H01L 27/1211 |
| 2017/0345824 A1* | 11/2017 | Ma | H01L 27/10811 |
| 2018/0211883 A1* | 7/2018 | Cheng | H01L 21/823487 |

FOREIGN PATENT DOCUMENTS

| | | |
|---|---|---|
| KR | 20150089597 A | 8/2015 |
| WO | 2017111845 A1 | 6/2017 |

\* cited by examiner

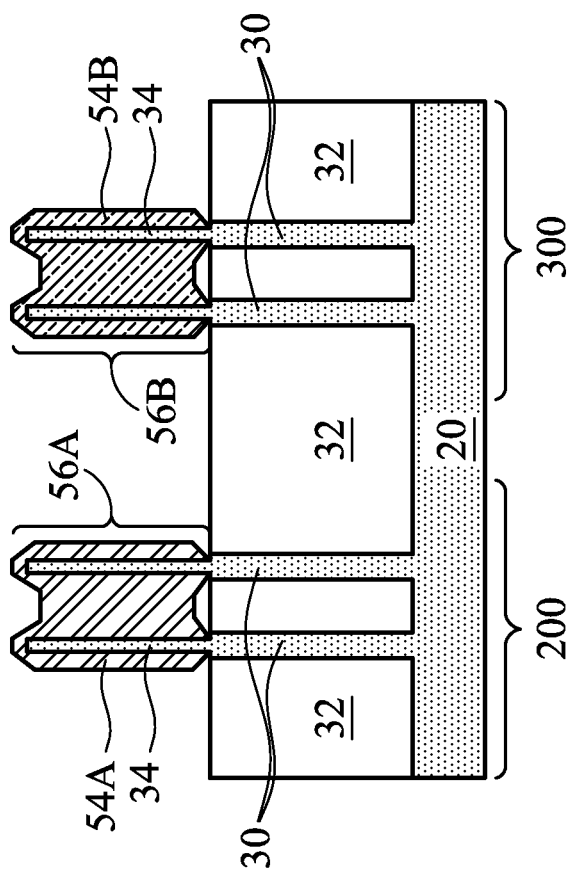
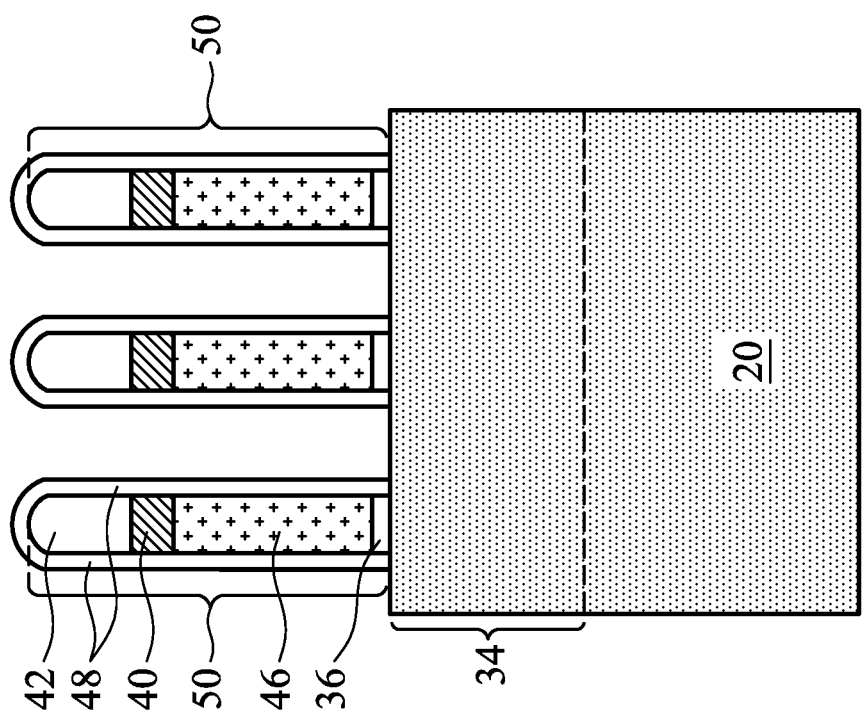
FIG. 9B
FIG. 9A

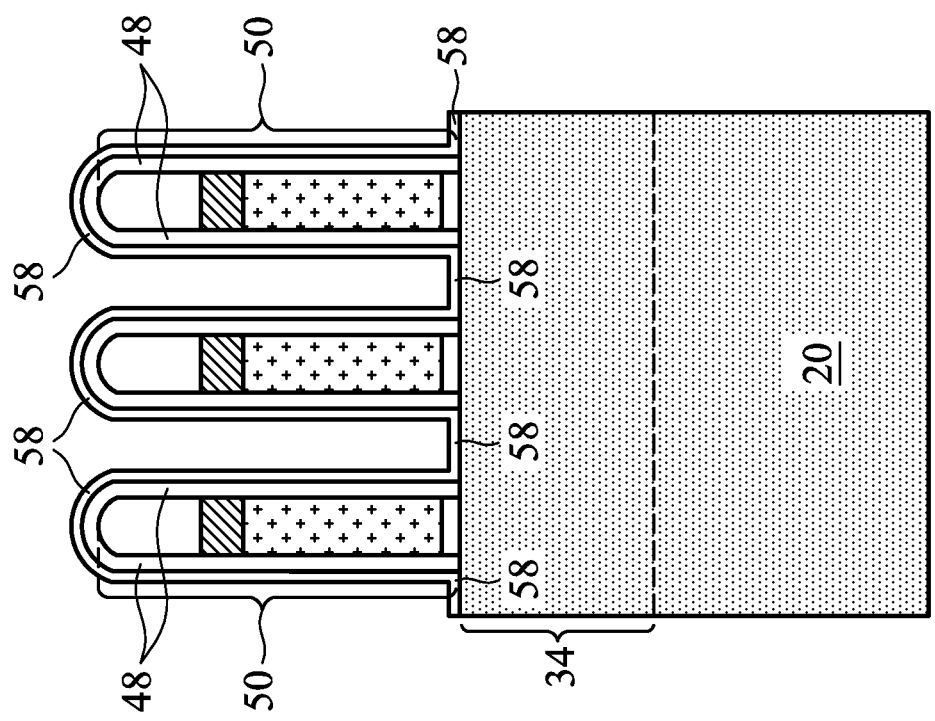
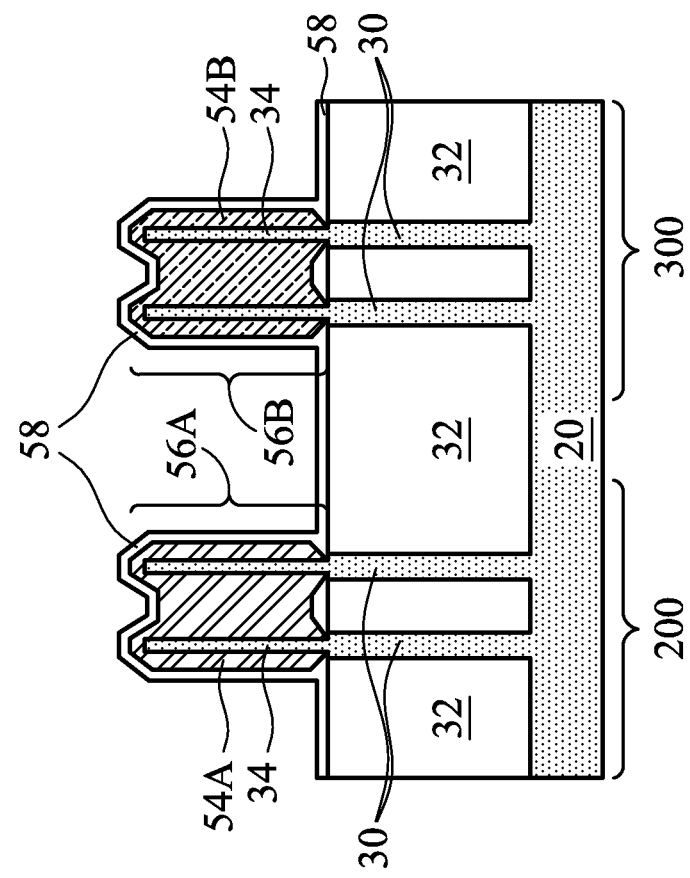
FIG. 10A
FIG. 10B

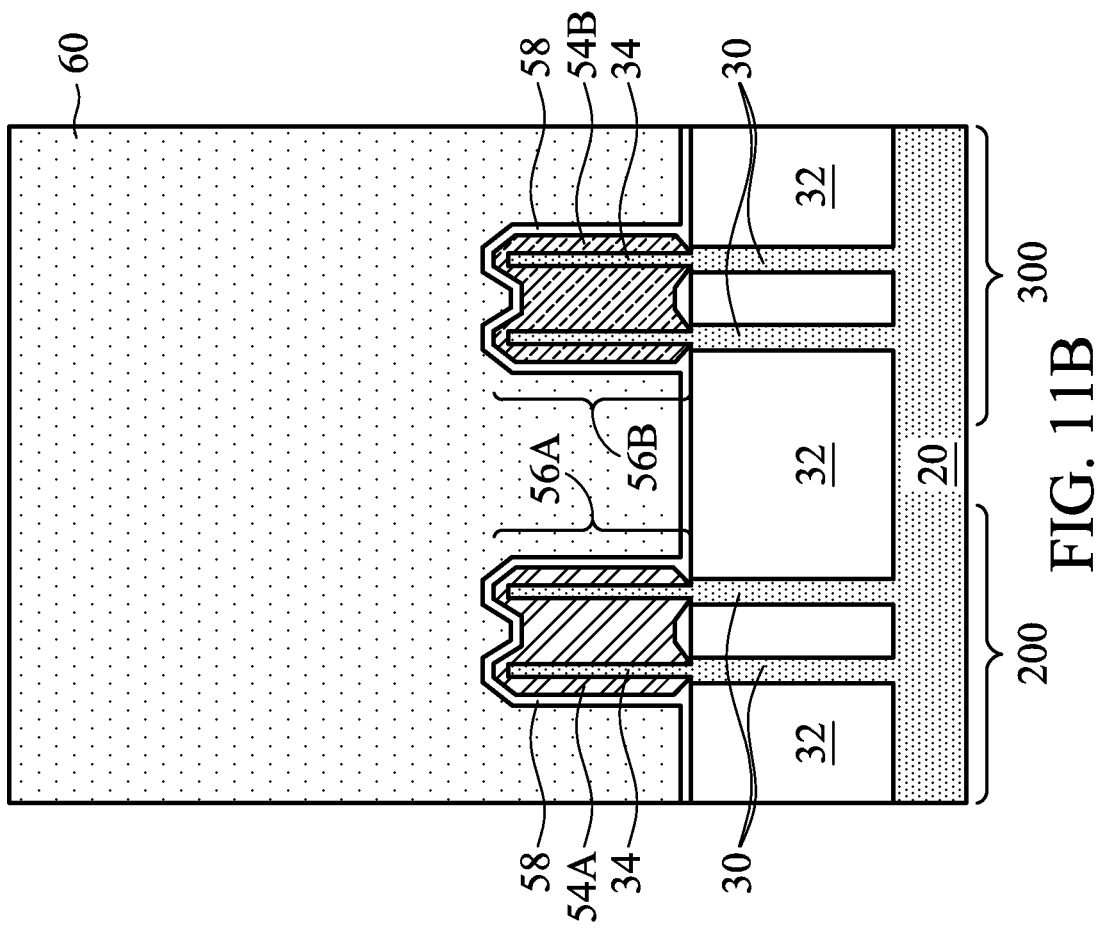
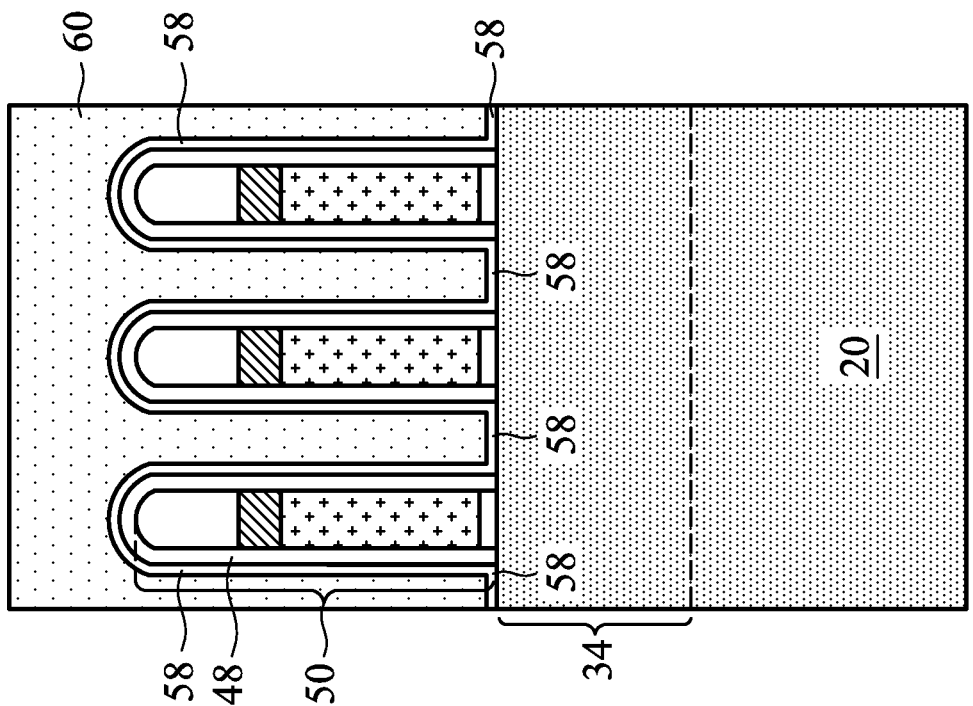
FIG. 11A
FIG. 11B

GAP-FILLING GERMANIUM THROUGH SELECTIVE BOTTOM-UP GROWTH

PRIORITY CLAIM AND CROSS-REFERENCE

This application is a continuation of U.S. patent application Ser. No. 15/800,471, entitled "Gap-Filling Germanium Through Selective Bottom-Up Growth," filed Nov. 1, 2017, which claims the benefit of the U.S. Provisional Application No. 62/565,595, filed Sep. 29, 2017, and entitled "Gap-Filling Germanium Through Selective Bottom-up Growth," which applications are hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 20A and 20B are perspective views and cross-sectional views of intermediate stages in the formation of Fin Field-Effect Transistors (FinFETs) in accordance with some embodiments.

DETAILED DESCRIPTION

Figure 2:
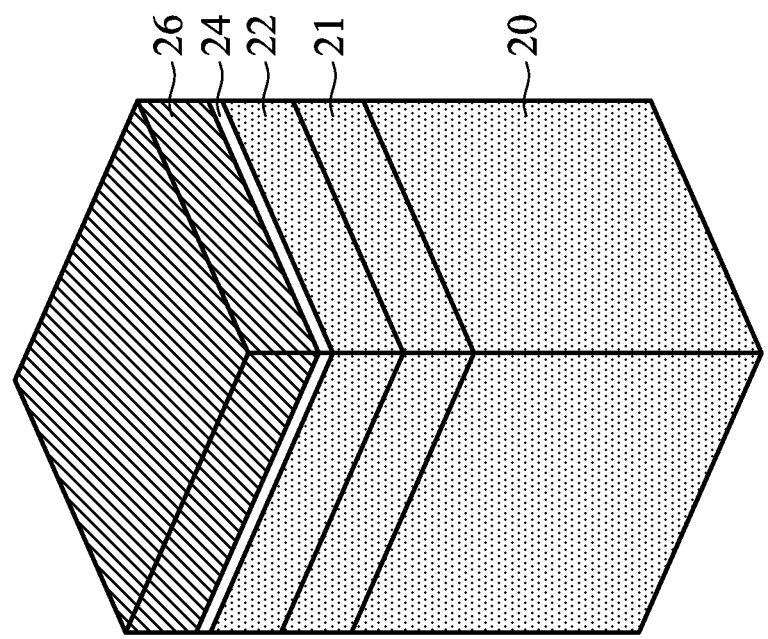

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the methods of forming the same are provided in accordance with various exemplary embodiments. Some exemplary gap-filling processes are discussed. The intermediate stages of forming the FinFETs are illustrated. Some variations of some embodiments are discussed. Throughout the various views and illustrative embodiments, like reference numbers are used to designate like elements.

Figure 28:
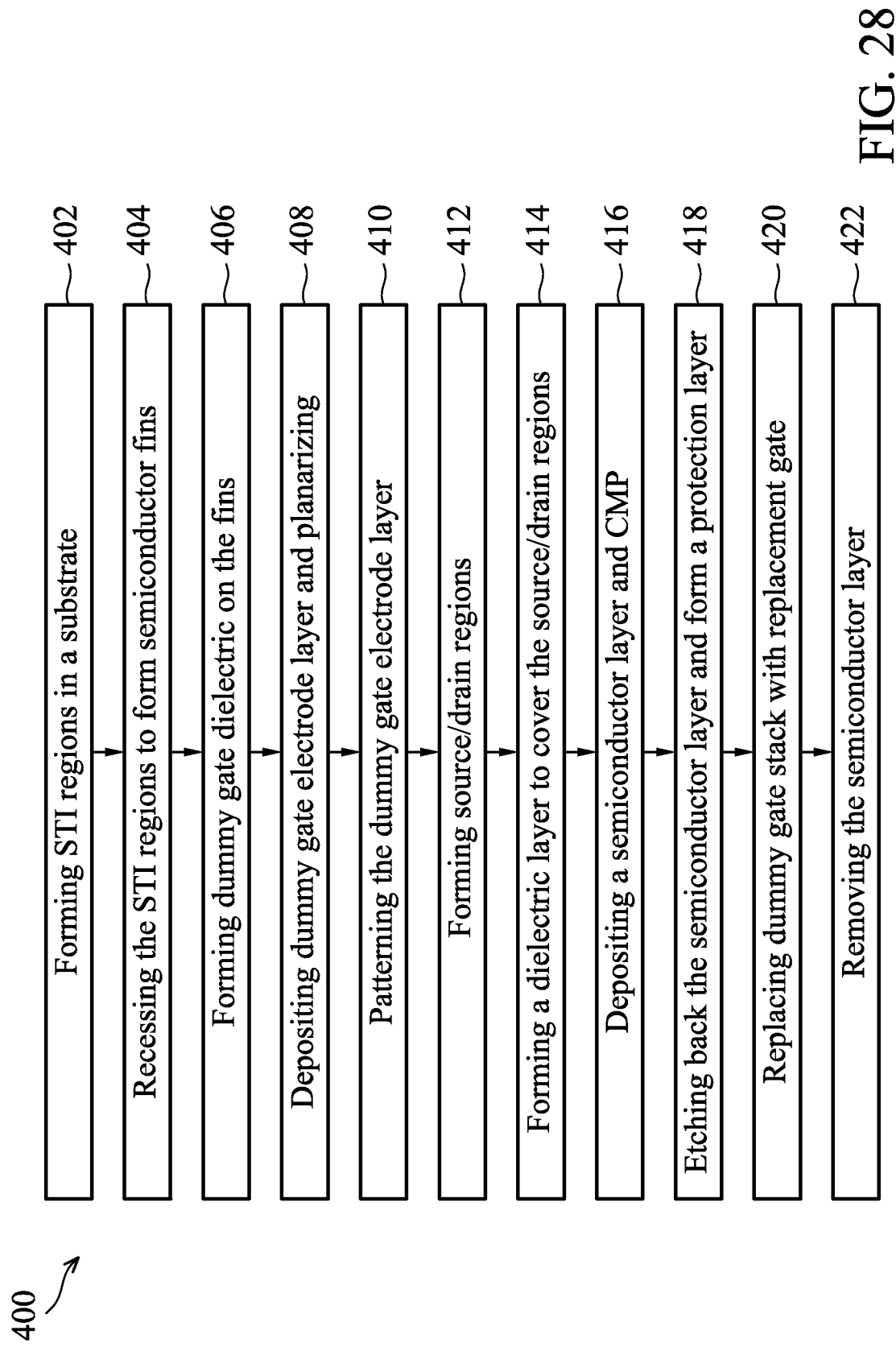
FIG. 28 illustrates a process flow for forming FinFETs in accordance with some embodiments.

FIGS. 1 through 20A and 20B illustrate the perspective views and cross-sectional views of intermediate stages in the formation of FinFETs in accordance with some embodiments. The steps shown in FIG. 1 through FIGS. 20A and 20B are also illustrated schematically in the process flow 400 as shown in FIG. 28.

Figure 1:
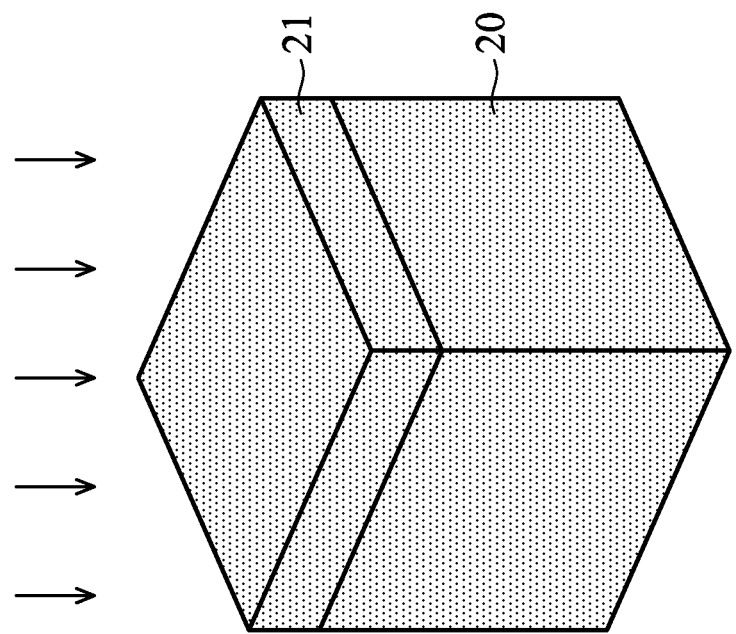

FIG. 1 illustrates a perspective view of substrate 20, which may be a part of a wafer. Substrate 20 may be a semiconductor substrate, such as a silicon substrate, a silicon carbon substrate, a silicon-on-insulator substrate or a substrate formed of other semiconductor materials. Substrate 20 may be lightly doped with a p-type or an n-type impurity. An Anti-Punch-Through (APT) implantation (illustrated by arrows) may be performed on a top portion of substrate 20 to form APT region 21. The conductivity type of the dopants implanted during the APT implantation is opposite to that of the source/drain region (not shown) of the respective FinFET to be formed. APT layer 21 extends under the subsequently formed source/drain regions in the resulting FinFET, which will be formed in subsequent steps, and is used to reduce the leakage from the source/drain regions to substrate 20. The doping concentration in APT layer 21 may be in the range between about $1E18/cm^3$ and about $1E19/cm^3$ in accordance with some exemplary embodiments. For clarity, in subsequent drawings, APT region 21 may not be illustrated.

Referring to FIG. 2, epitaxy semiconductor layer 22 is grown on substrate 20 through epitaxy. Throughout the description, epitaxy semiconductor layer 22 and substrate 20 in combination are also be referred to as a semiconductor substrate. Epitaxy semiconductor layer 22 may include silicon germanium (SiGe), silicon carbon, or silicon (free from germanium and carbon). When formed of SiGe, the germanium percentage (atomic percentage) of epitaxy semiconductor layer 22 may be in the range between about 25 percent and about 35 percent, while higher or lower germanium percentages may be used. It is appreciated, however, that the values recited throughout the description are examples, and may be changed to different values.

Pad oxide 24 and hard mask 26 are formed over epitaxy semiconductor layer 22. In accordance with some embodiments of the present disclosure, pad oxide 24 is formed of silicon oxide, which may be formed by oxidizing a surface layer of semiconductor layer 22. Hard mask 26 may be formed of silicon nitride, silicon oxynitride, silicon carbide, silicon carbo-nitride, or the like.

Figure 3:
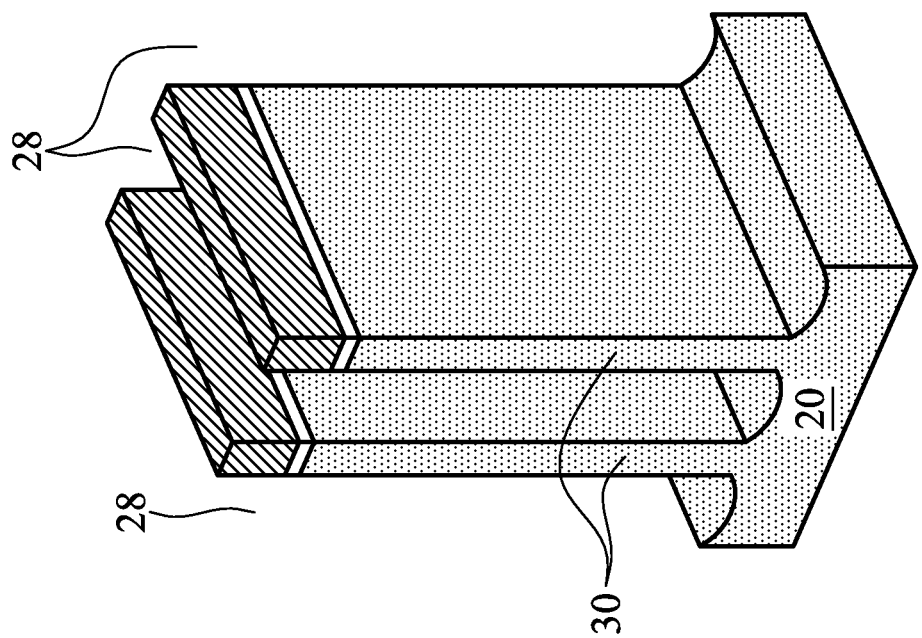

Next, as shown in FIG. 3, hard mask 26, pad oxide 24, semiconductor layer 22, and substrate 20 are patterned in an etching step to form trenches 28. Accordingly, semiconductor strips 30 are formed. Trenches 28 extend into semiconductor layer 22 and substrate 20, and have lengthwise directions parallel to each other.

Figure 4:
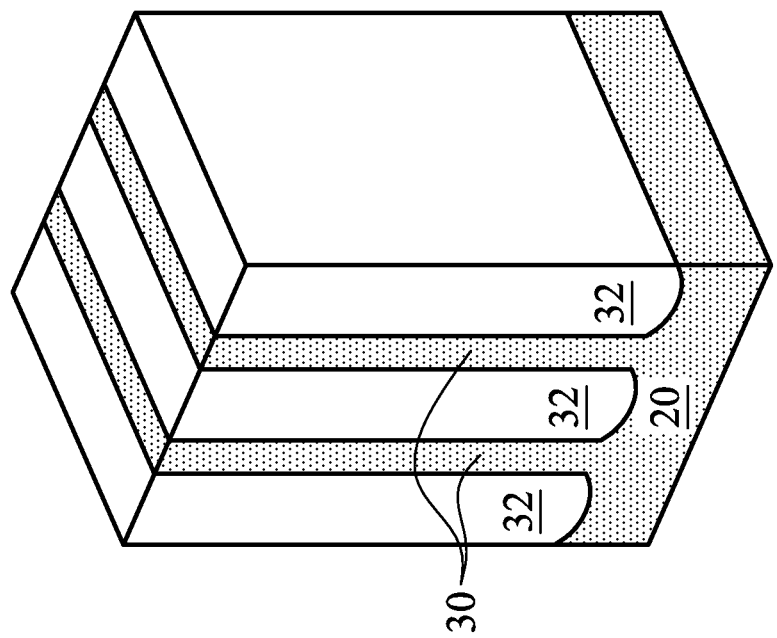

Next, as shown in FIG. 4, isolation regions 32, which are alternatively referred to as Shallow Trench Isolation (STI) regions, are formed in trenches 28 (FIG. 3). The respective step is illustrated as step 402 in the process flow shown in FIG. 28. The formation of STI regions 32 may include filling trenches 28 with a dielectric layer(s), for example, using Flowable Chemical Vapor Deposition (FCVD). A planarization such as Chemical Mechanical Polish (CMP) and mechanical polish is then performed to level the top surface of the dielectric material with the top surface of hard mask 26 or the top surfaces of isolation regions 32. After the CMP, hard mask 26 and pad oxide 24 (FIG. 3) are removed.

Figure 5:
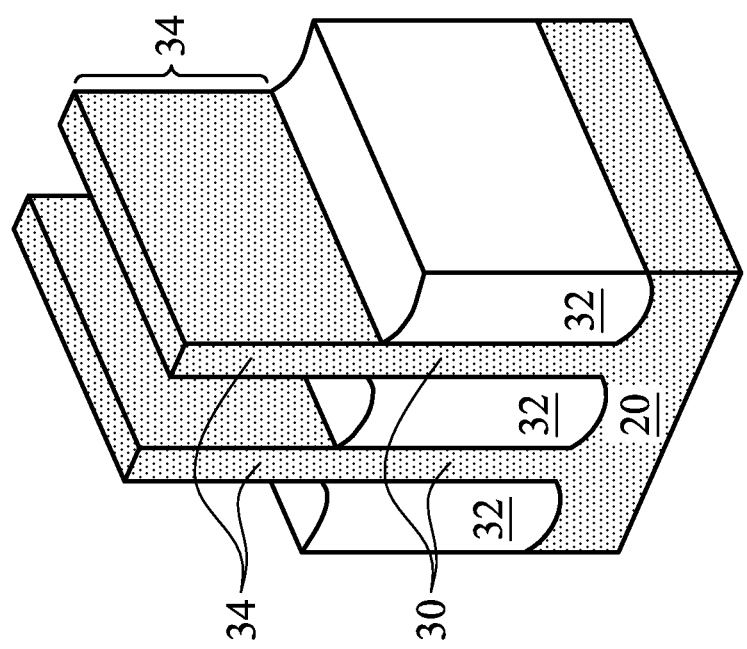

Next, referring to FIG. 5, STI regions 32 are recessed, so that the top surfaces of the resulting STI regions 32 are lower than the top surface of semiconductor strips 30. The respective step is illustrated as step 404 in the process flow shown in FIG. 28. Throughout the description, the upper portions of semiconductor strips 30, which upper portions are higher than the top surfaces of STI regions 32, are referred to as semiconductor fins 34. The lower portions of semiconductor strips 30 lower than the top surfaces of STI regions 32 remain to be referred to as semiconductor strips 30.

Figure 6:
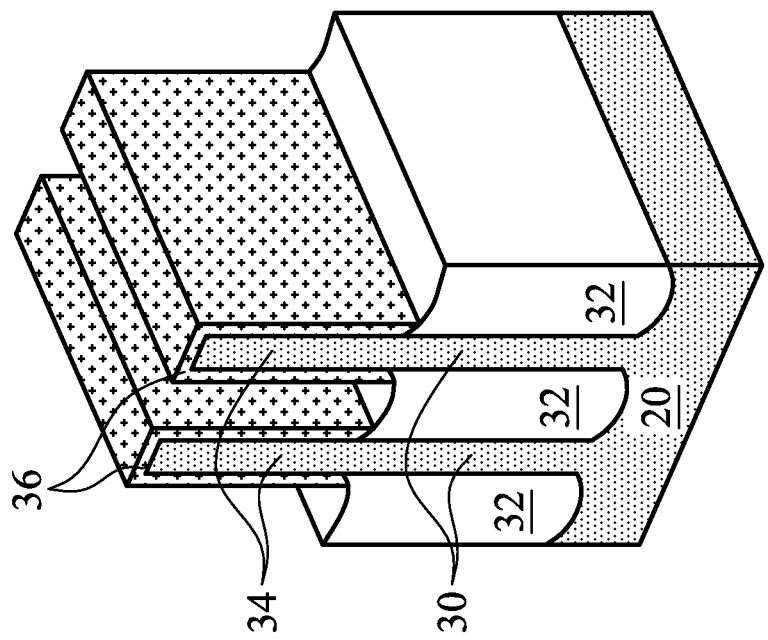

FIG. 6 illustrates the formation of dummy gate dielectric 36. Dummy gate dielectric 36 may include silicon oxide (and hence may be referred to as a gate oxide) in accordance with some embodiments. Dummy gate dielectric 36 may also be formed of other dielectric materials such as silicon nitride. The respective step is illustrated as step 406 in the process flow shown in FIG. 28. Dummy oxide 36 may be formed through deposition or oxidizing the surface layers of semiconductor fins 34. Accordingly, dummy oxide 36 may or may not extend on the top surfaces of STI regions 32. Dummy oxide 36 is also formed simultaneously as the gate dielectric of Input-output (IO) FinFETs.

Figure 7:
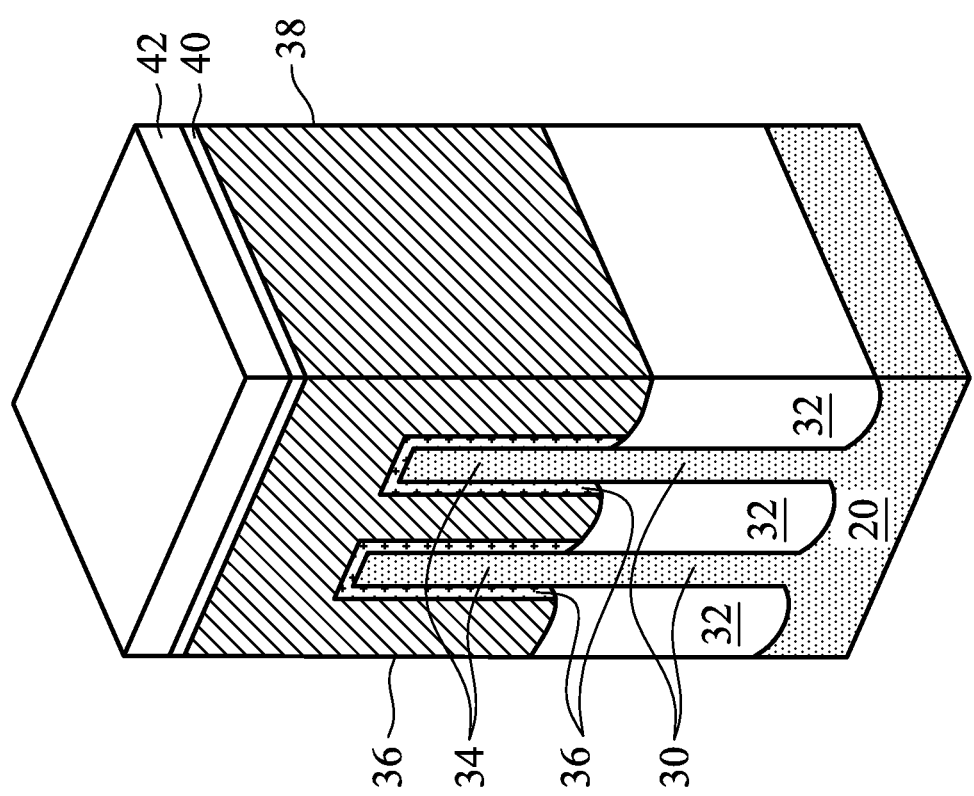

FIG. 7 illustrates the formation of dummy gate electrode layer 38, which is formed of polysilicon or amorphous silicon in accordance with some embodiments. Dummy gate electrode layer 38 is planarized. The respective step is illustrated as step 408 in the process flow shown in FIG. 28. An exemplary formation process of dummy gate electrode layer 38 is shown in detail in the process shown in FIGS. 21 through 28, and will be discussed in subsequent paragraphs. The resulting dummy gate electrode layer 38 is seam-free and void-free and bending-free.

As also shown in FIG. 7, hard mask 40 and hard mask 42 are formed. Hard mask 40 and hard mask 42 may be formed of materials selected from, and not limited to, silicon oxide, silicon nitride, silicon carbide, silicon oxynitride, silicon oxy-carbide, silicon oxy-carbo-nitride, and the like. In accordance with some embodiments of the present disclosure, hard mask 40 is formed of silicon nitride, and hard mask 42 is formed of silicon oxide.

Referring again to FIG. 8, hard mask 40 and hard mask 42 are patterned through etching. A photo resist (not shown) is used for defining the patterns of hard masks 40 and 42. The patterned hard masks 40 and 42 are used to further pattern dummy gate electrode layer 38 (FIG. 7), with the patterned hard masks 40 and 42 being used as an etching mask. The respective step is illustrated as step 410 in the process flow shown in FIG. 28. The etching of hard masks 40 and 42 and dummy gate electrode layer 38 are performed using anisotropic etching methods. The remaining portion of dummy gate electrode layer 38 is referred to as dummy gate electrode 46 hereinafter. The etchant gas is selected depending on the material of dummy gate electrode layer 38, and may include a mixture of chlorine ($Cl_2$) and nitrogen ($N_2$), a mixture of fluorine ($F_2$) and nitrogen ($N_2$), or a mixture of $NF_3$ and $H_2$ and helium (He) when dummy gate electrode layer 38 is formed of polysilicon or amorphous silicon.

After the patterning of dummy gate electrode layer 38, the exposed portions of dummy oxide 36 that are not covered by dummy gate electrode 46 are removed in an etching step. In subsequent discussion, dummy oxide 36, dummy gate electrode 46, and hard masks 40 and 42 in combination are referred to as dummy gate stack 50.

FIGS. 9A and 9B through FIGS. 20A and 20B illustrate the cross-sectional views of intermediate stages in the formation of remaining portions of FinFETs in accordance with some embodiments of the present disclosure. In FIGS. 9A and 9B through 20A and 20B, the figure numbers include letter "A" or letter "B." The letter "A" indicates that the respective figure is a cross-sectional view obtained from the vertical planes same as the vertical plane containing line A-A in FIG. 8. The letter "B" indicates that the respective figures are obtained from the vertical planes same as the vertical plane containing line B-B in FIG. 8. Also, the device region as shown in the figures whose figure numbers having the letter "B" includes portions in device region 200 and portions in device region 300. Device region 200 is an n-type FinFET region, and device region 300 is a p-type FinFET region. The figures having the same digits and different letters indicate they are the different views of a same process step. Furthermore, the gate structures as shown in the figures whose figure numbers having the letter "A" may be the actual gates (or dummy gates) of p-type FinFETs or n-type FinFETs.

Figure 8:
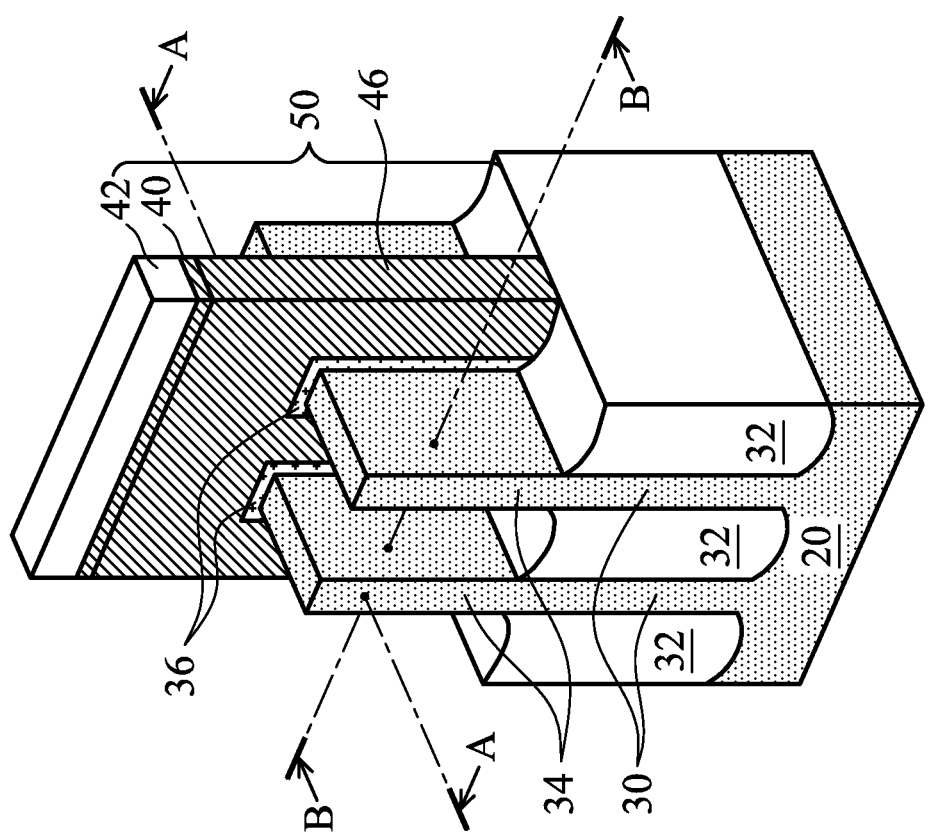

FIG. 9A illustrates a plurality of dummy gate stacks 50, which are strips when viewed from the top of FIG. 9A. Dummy gate stacks 50 extend on the sidewalls and the top surface of semiconductor fin 34, as is shown in FIG. 8. After the step as shown in FIG. 8, first gate spacers 48 are formed. First gate spacers 48 include portions on the sidewalls of dummy gate stacks 50. Although some subsequent figures show that gate spacers 48 include top portions overlapping dummy gate stacks 50, the top portions of gate spacers 48 may be removed, and may not exist in FIGS. 10A, 11A, and 12A.

FIG. 9B illustrates the formation of epitaxy semiconductor regions 54A and 54B in device regions 200 and 300, respectively. Source/drain regions 56A and 56B are also formed. The respective step is illustrated as step 412 in the process flow shown in FIG. 28. In accordance with some embodiments of the present disclosure, source/drain regions 56A and 56B are formed as cladding source/drain regions, as shown in FIG. 9B, in which epitaxy semiconductor regions 54A and 54B are epitaxially grown on the exposed protruding fins 34. Epitaxy regions 54A and 54B represent the epitaxy regions for forming different types of FinFETs. Depending on whether the resulting FinFET is a p-type FinFET or an n-type FinFET, a p-type or an n-type impurity may be in-situ doped with the proceeding of the epitaxy. For example, epitaxy regions 54A may include silicon phosphorous (SiP), silicon carbon phosphorous (SiCP), or the like, and the respective resulting FinFET is an n-type FinFET.

Epitaxy regions 54B may include silicon germanium boron (SiGeB), SiB, or the like, and the resulting FinFET is a p-type FinFET. In accordance with alternative embodiments of the present disclosure, epitaxy regions 54A and/or 54B are formed of a III-V compound semiconductor such as GaAs, InP, GaN, InGaAs, InAlAs, GaSb, AlSb, AlAs, AlP, GaP, combinations thereof, or multi-layers thereof. When epitaxy regions 54A and 54B are formed of different materials, they are formed in different epitaxy processes, and the corresponding masks (not shown) are used to allow the epitaxy occurs on one of epitaxy regions 54A and 54B, but not on the other.

In accordance with alternatively embodiments, instead of directly growing epitaxy regions on protruding fins 34, an etching step (referred to as source/drain recessing hereinafter) is performed to etch the portions of protruding fins 34 that are not covered by dummy gate stack 50 and gate spacers 48, so that recesses are formed. Epitaxy regions 54A and 54B are then grown from the recesses.

An implantation step(s) may be performed to implant the desirable p-type or n-type impurity such as boron or phosphorous into protruding fins 34 and epitaxy regions 54A and 54B. The protruding fins 34 and the corresponding epitaxy regions 54A and 54B in combination are referred to as source/drain regions 56A and 56B, respectively. In accordance with alternative embodiments of the present disclosure, the implantation step is skipped when epitaxy regions 54A and 54B are in-situ doped with the p-type or n-type impurity.

FIGS. 10A and 10B illustrate the formation of dielectric layer 58, which is formed as a conformal layer on gate spacers 48, gate stacks 50, and source/drain regions 56A and 56B. The respective step is illustrated as step 414 in the process flow shown in FIG. 28. Dielectric layer 58 may be a silicon oxide layer, a silicon nitride layer, or the like, and may be formed using Low-Pressure Chemical Vapor Deposition (LPCVD), Atomic Layer Deposition (ALD), Chemical Vapor Deposition (CVD), or the like.

Referring to FIGS. 11A and 11B, semiconductor layer 60 is deposited. The respective step is illustrated as step 416 in the process flow shown in FIG. 28. In accordance with some embodiments of the present disclosure, semiconductor layer 60 includes an amorphous semiconductor or a poly semiconductor, which may include silicon, germanium, silicon germanium, or the like. The details of the formation process are shown in detail in FIGS. 21 through 28. Semiconductor layer 60 is deposited to a level higher than the top surfaces of gate stacks 50 and gate spacers 48.

Figure 12B:
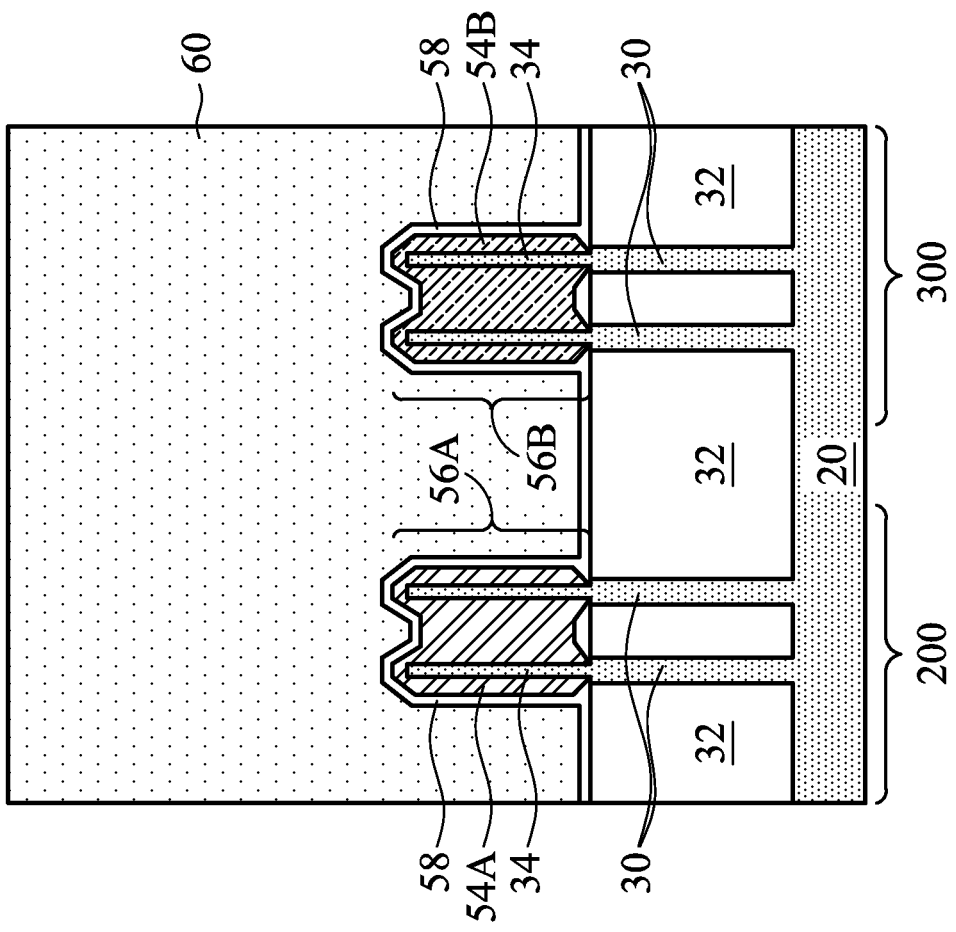
Figure 12A:
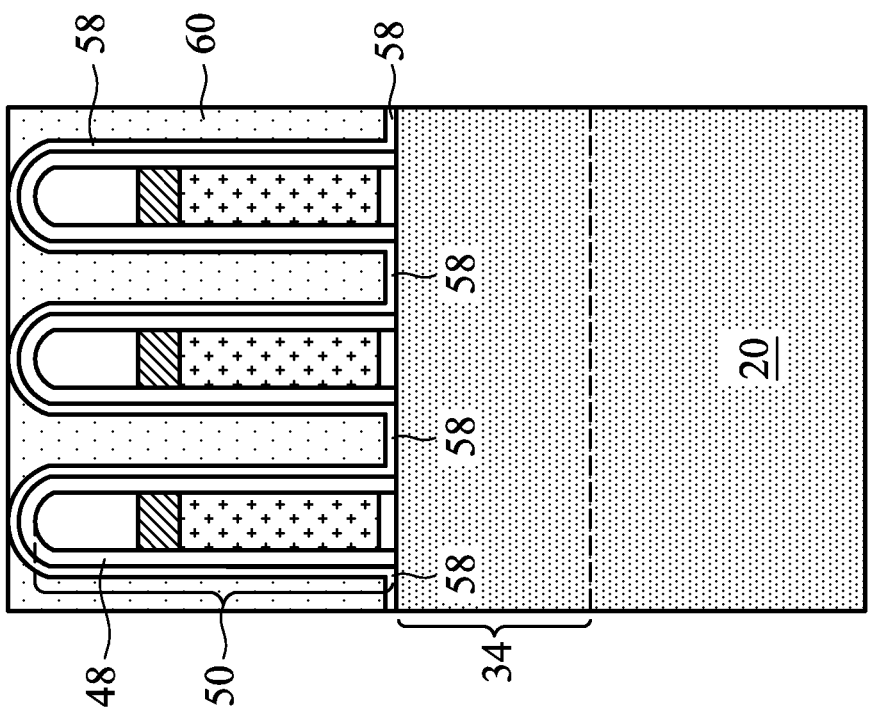
Figure 13B:
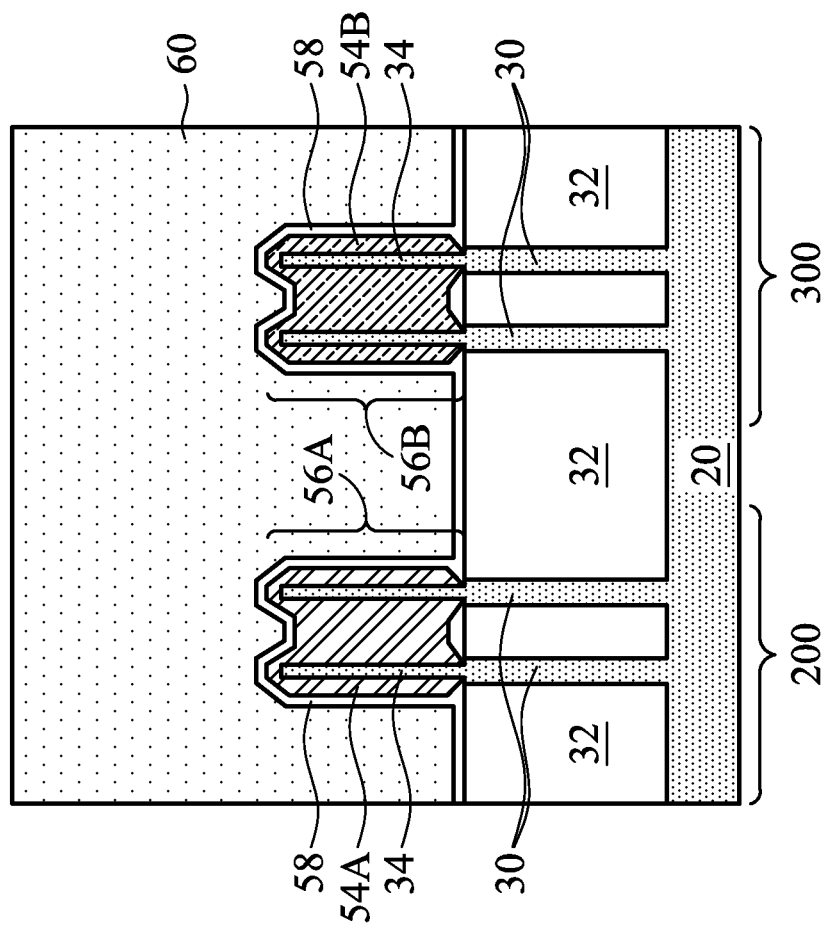
Figure 13A:
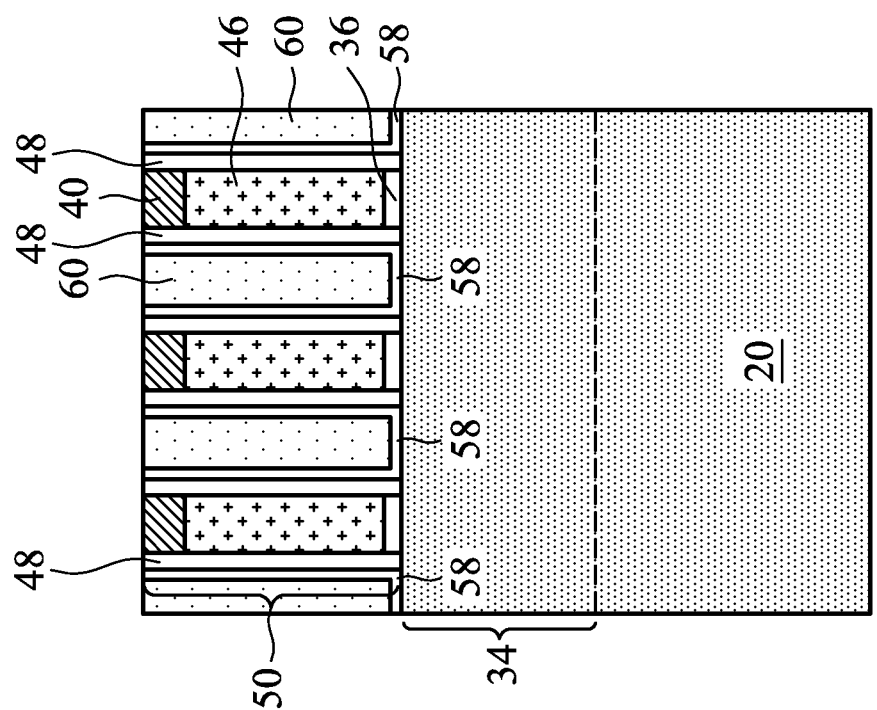

FIGS. 12A and 12B illustrate a planarization step for planarizing the top surface of semiconductor layer 60. The respective step is also illustrated as step 416 in the process flow shown in FIG. 28. Next, as shown in FIGS. 13A and 13B, a further planarization is performed until hard masks 42 (FIG. 12A) are removed, and the planarization stops on the top surfaces of hard masks 40.

Figure 14B:
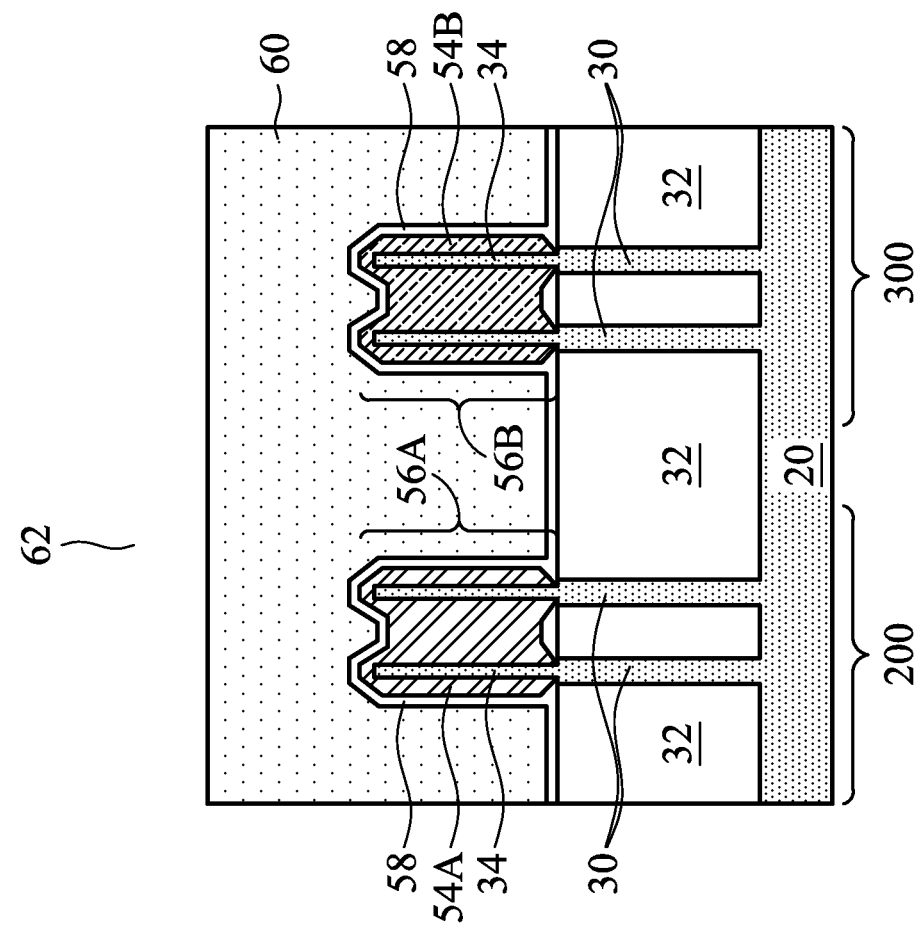
Figure 14A:
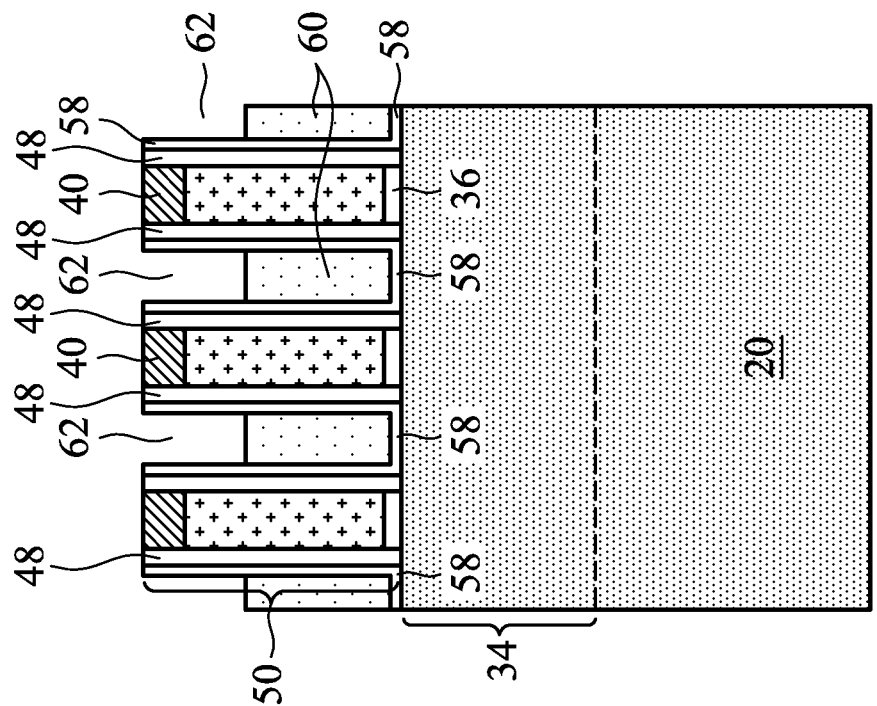

Next, an etch-back is performed to lower the top surface of semiconductor layer 60, and hence recesses 62 are formed between gate stacks 50, as shown in FIGS. 14A and 14B. The respective step is illustrated as step 418 in the process flow shown in FIG. 28. Recesses 62 are then filled with protection layer 64, which is show in FIGS. 15A and 15B. The formation process includes filling recesses 62 with a material first, which may be oxide, silicon carbo-nitride, silicon oxy-carbo-nitride, or the like. In accordance with some exemplary embodiments, the formation process includes depositing a silicon oxide layer using ALD, and then depositing another silicon oxide layer using CVD. The ALD oxide layer may have a thickness in the range between about 10 nm and about 30 nm, and the CVD oxide layer may have thickness between about 50 nm and about 150 nm. After the deposition, a planarization step such as CMP or mechanical grinding is performed to level the top surface of the resulting protection layer 64 with the top surfaces of dummy gate electrodes 46, so that dummy gate electrodes 46 are exposed.

Figure 15B:
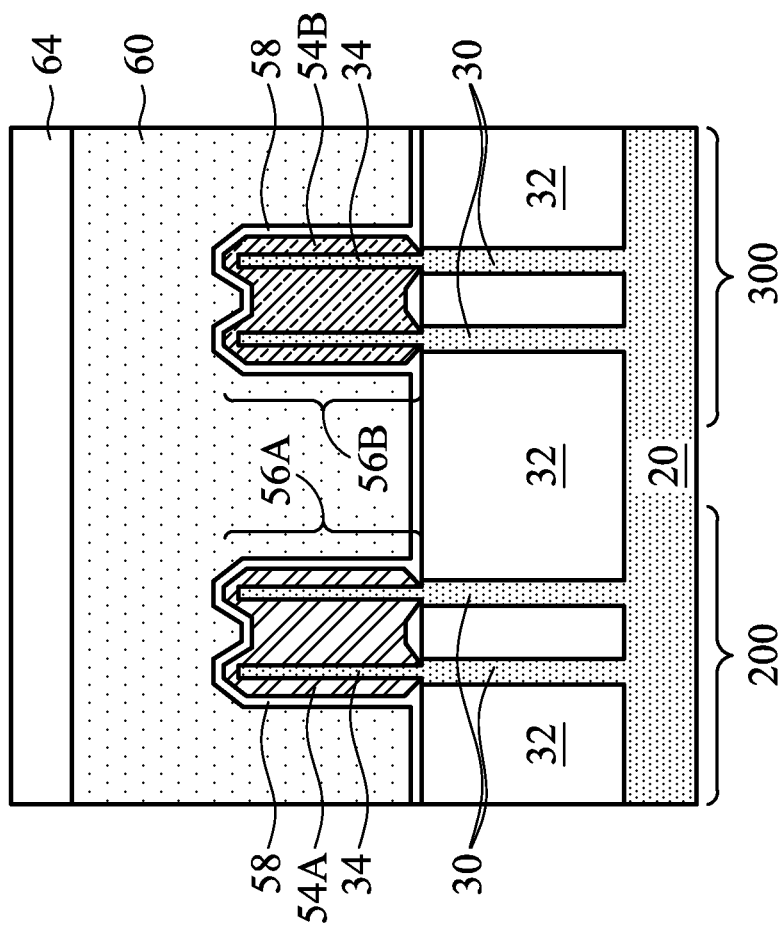
Figure 15A:
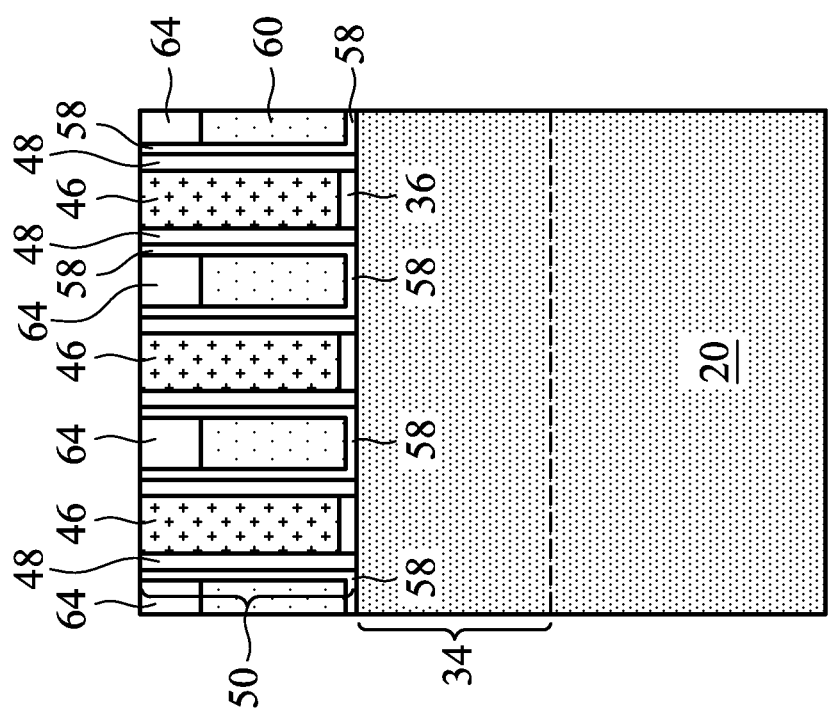
Figure 16B:
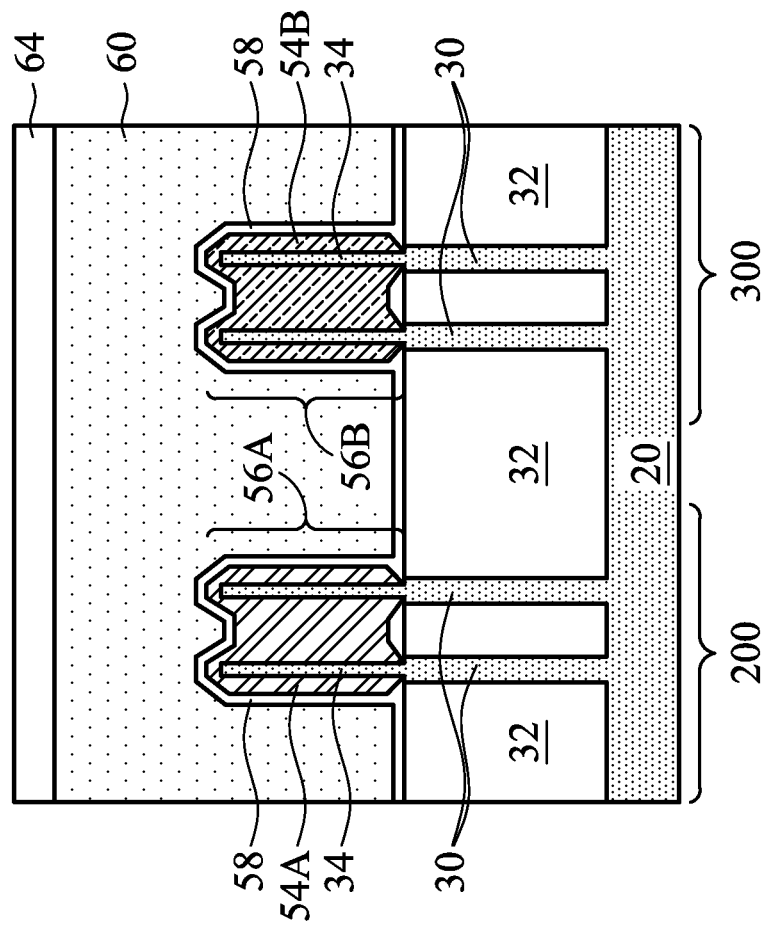
Figure 16A:
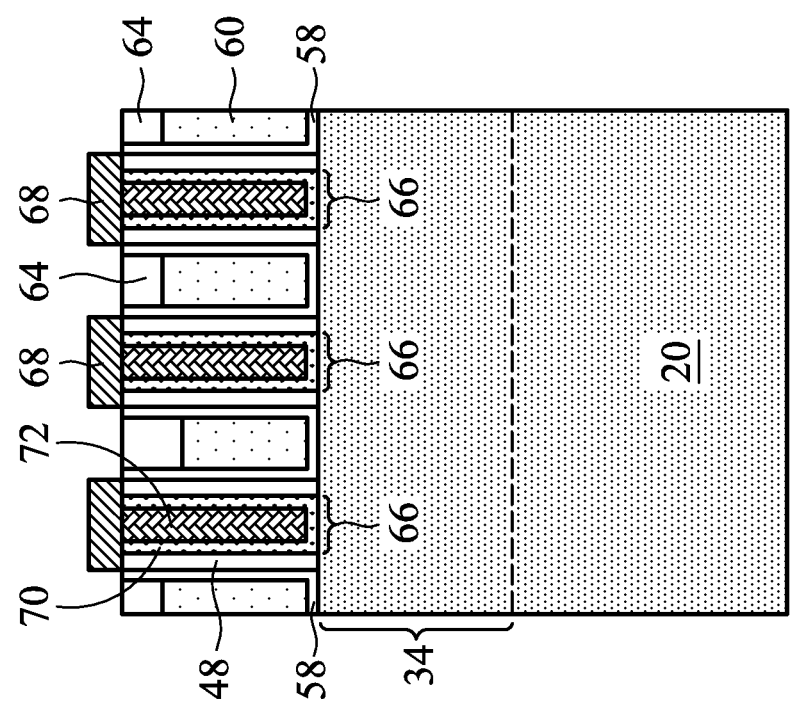

FIGS. 16A and 16B illustrate the formation of replacement gates 66 and hard masks 68. The respective step is illustrated as step 420 in the process flow shown in FIG. 28. To form the replacement gates, dummy gate electrodes 46 and dummy gate dielectrics 36 as shown in FIG. 15A are first etched, resulting in recesses between gate spacers 48. Replacement gates 66 are then formed in the recesses. Replacement gates 66 include gate dielectrics 70 and gate electrodes 72. In accordance with some embodiments, the formation of gate dielectric 70 includes performing an interfacial (dielectric) layer, and then forming a high-k dielectric layer on the interfacial layer. The interfacial layer may include silicon oxide formed by thermal oxidation of semiconductor fins 34. Alternatively, the interfacial layer is formed by treating the exposed surfaces of semiconductor fins 34 in a chemical solution, so that semiconductor fins 34 are oxidized to form a chemical oxide (silicon oxide). The high-k dielectric is then deposited on the interfacial layer. In accordance with some embodiments, the high-k dielectric has a k value greater than about 7.0, and may include a metal oxide or a silicate of Hf, Al, Zr, La, and the like.

Replacement gate electrodes 72 are formed over replacement gate dielectric 70. Replacement gate electrode 72 may include a metal-containing material such as TiN, TaN, TaC, Co, Ru, Al, Cu, W, combinations thereof, or multi-layers thereof. After the formation of gate dielectric 70 and gate electrode 72, a planarization such as CMP is performed to remove excess portions of the gate dielectric and gate electrode over protection layer 64.

As also shown in FIG. 16A, hard masks 68 are formed. In accordance with some embodiments of the present disclosure, hard masks 68 are formed through selective dielectric deposition. For example, hard masks 68 may be formed of silicon nitride, which are selectively deposited on replacement gates 66 and gate spacers 48, and not on protection layer 64, which may be formed of silicon oxide, for example. The selective deposition is achieved through the difference between the materials of protection layer 64 and other materials such as 48 and 66. As a result, hard masks 68 are self-aligned to replacement gates 66 and possibly spacers 48, and not on protection layer 64. Protection layer 64 hence remains to be exposed.

Figure 17B:
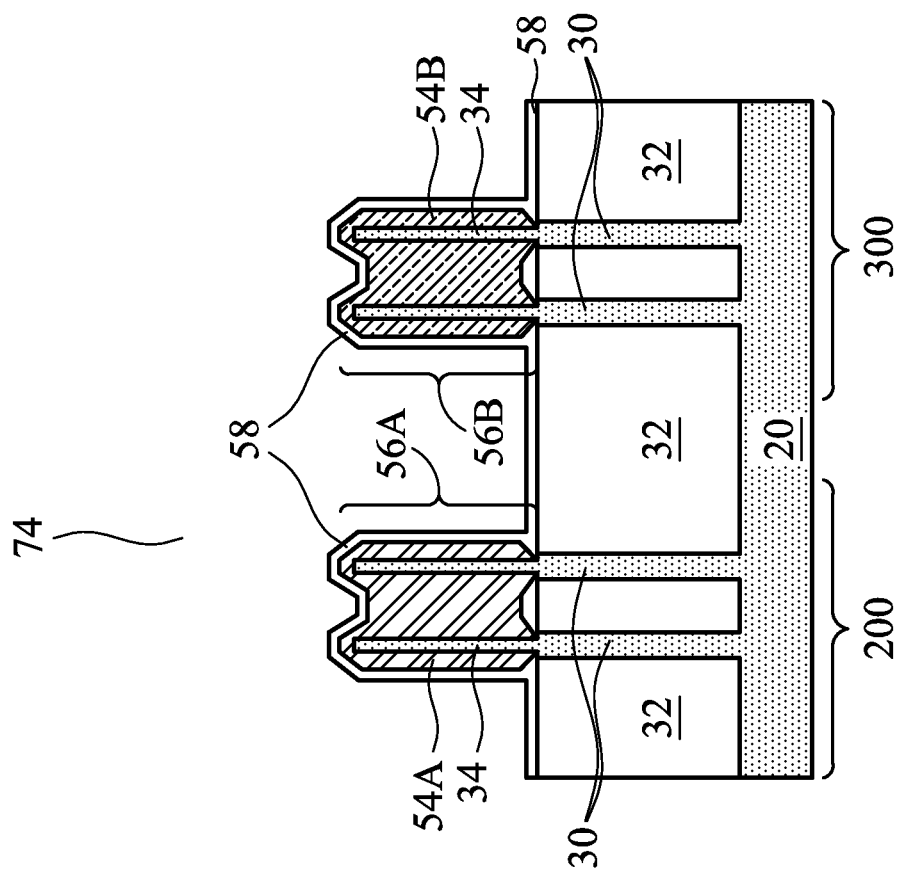
Figure 17A:
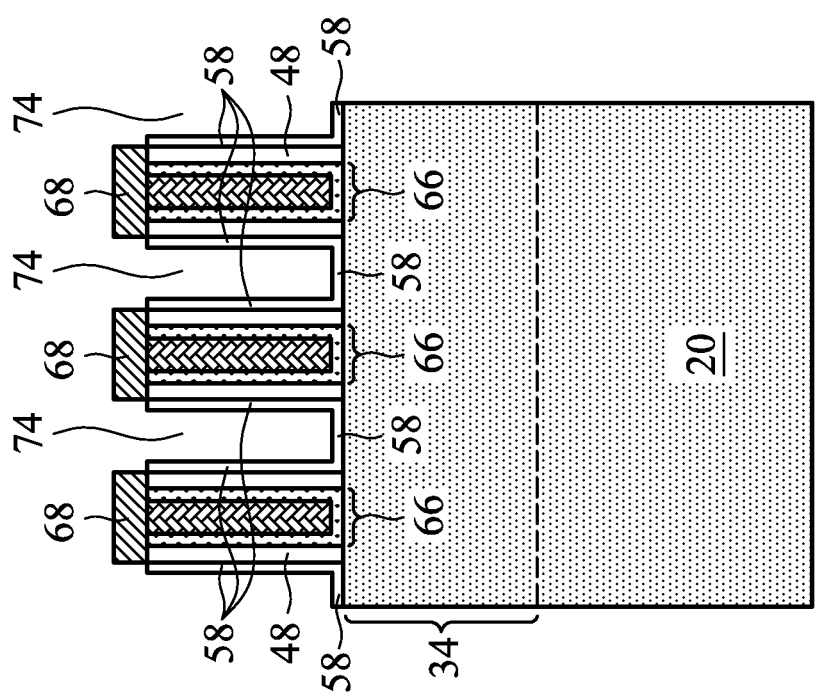
Figure 20B:
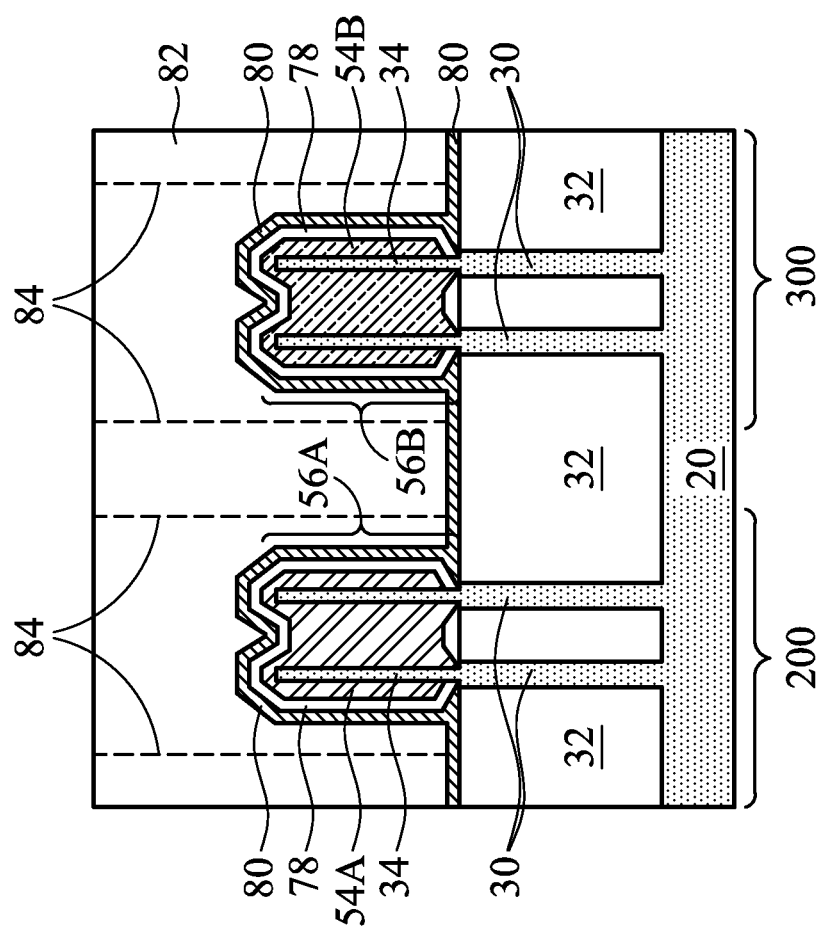
Figure 20A:
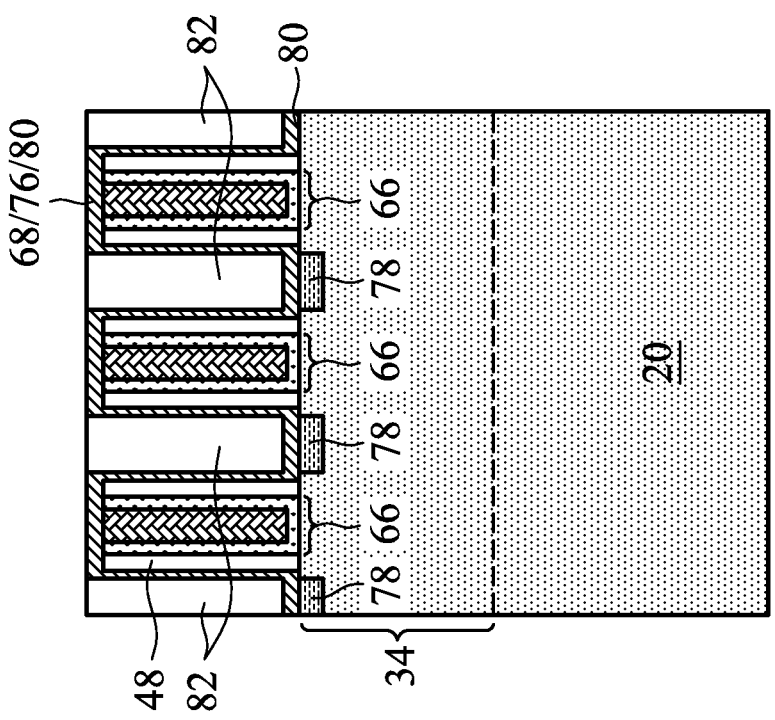

Protection layer 64 and the underlying semiconductor layer 60 are then etched, resulting in the recesses 74 as shown in FIGS. 17A and 17B. In accordance with some embodiments of the present disclosure, all parts of semiconductor layer 60 are removed, and semiconductor layer 60 is used as a sacrificial layer in the preceding process. The respective step is illustrated as step 422 in the process flow shown in FIG. 28. It is advantageous to use semiconductor material such as silicon and/or germanium to form protection layer 60 since silicon and/or germanium has a high etching selectivity over the materials of gate spacers 48 and oxide layer 58. Hence, in the removal of semiconductor layer 60, the damage to gate spacers 48 and oxide layer 58 is minimized. As a comparison, if the actual Inter-Dielectric Layer (ILD) (such as ILD 82 as shown in FIGS. 20A and 20B) was used in FIGS. 11A and 11B, since ILD 82 and gate spacers 48 have smaller etching selectivity, gate spacers 48 may be damaged in the preceding steps.

Figure 18B:
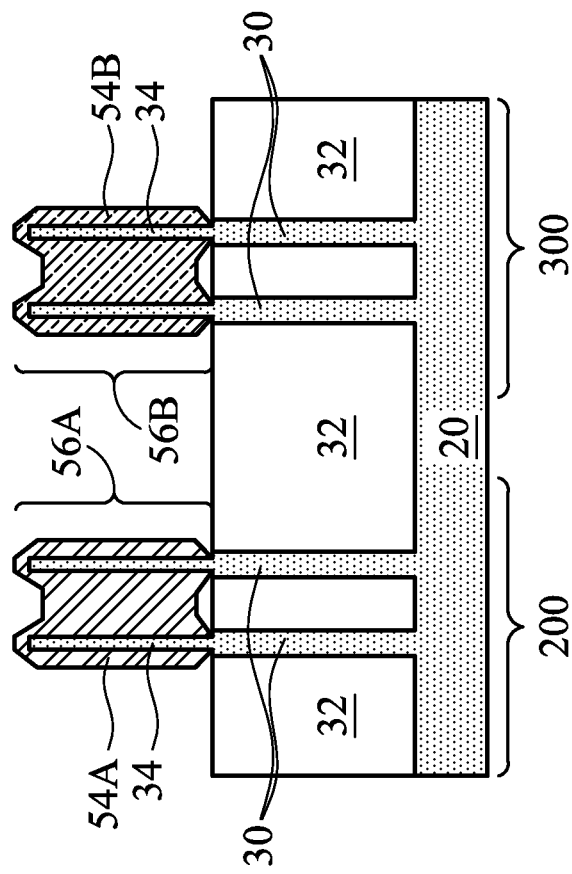
Figure 18A:
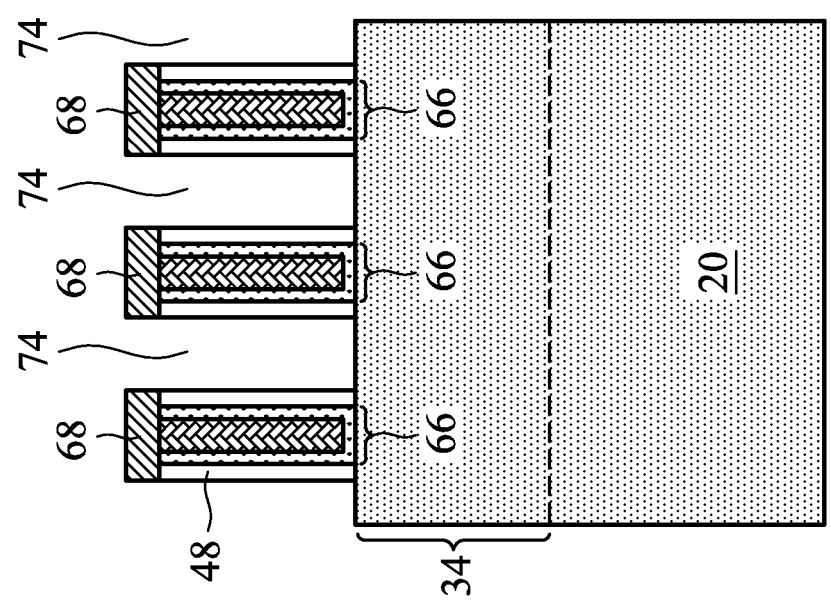

Oxide layer 58 as shown in FIGS. 17A and 17B is then etched, and the resulting structure is shown in Figure FIGS. 18A and 18B, respectively. The etching may be performed using, for example, a mixture of $NF_3$ and $NH_3$ gases, a mixture of HF and $NH_3$ gases, or a solution of HF.

Figure 19B:
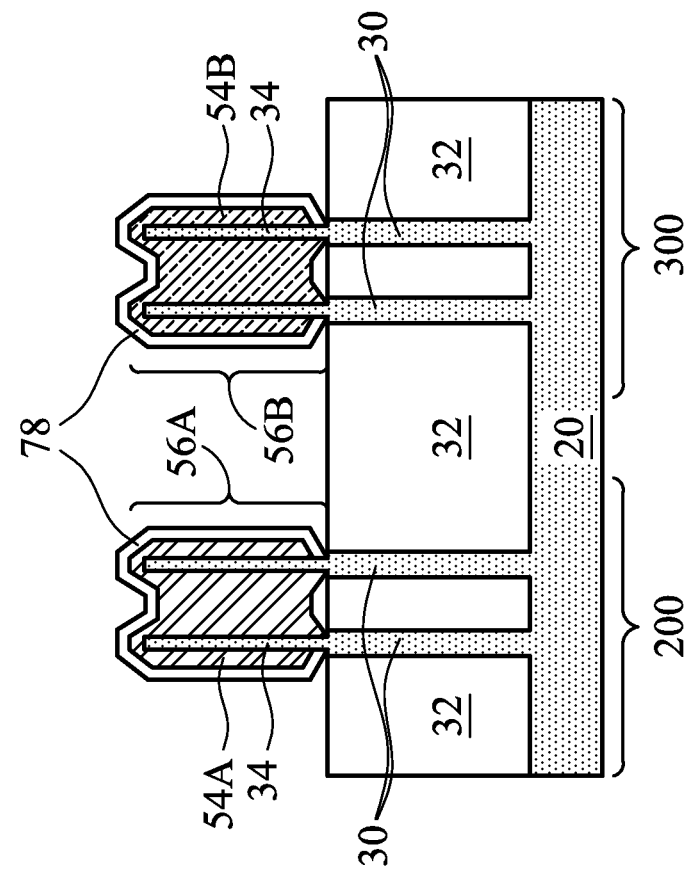
Figure 19A:
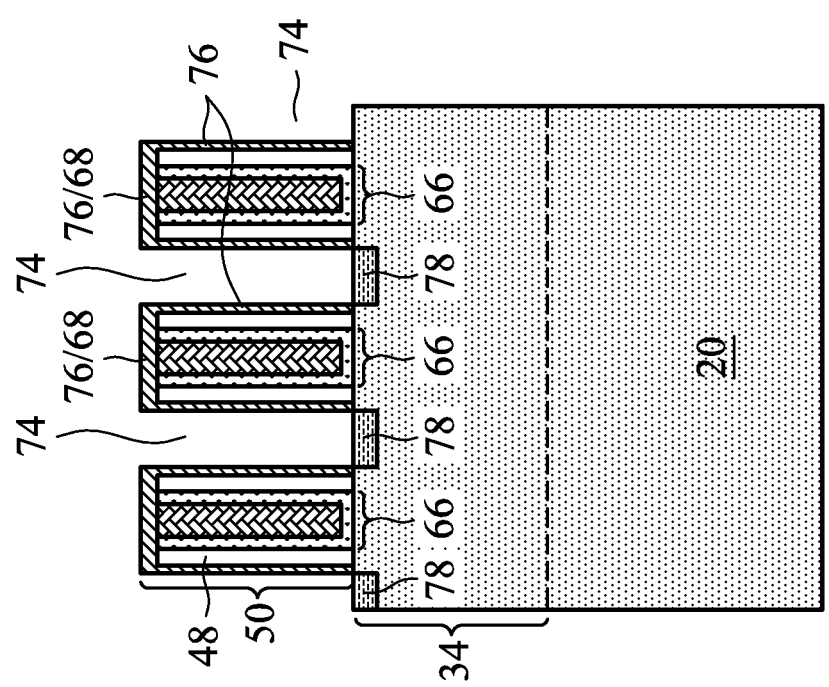

FIG. 19A illustrates the formation of additional gate spacers 76 and silicide layers 78. In accordance with some exemplary embodiments, an oxide layer (not shown) is formed on the exposed surfaces of source/drain regions 56A and 56B, for example, through thermal oxidation. Additional gate spacers 76 are then formed through selective dielectric deposition. Since the selective dielectric deposition results in gate spacers 76 to be prohibited (and hence will not grow) on oxide, the dielectric material of gate spacers 76 is not formed on the oxide layer (not shown) on source/drain regions 56A and 56B. The same material for forming gate spacers 76 may also be formed on hard masks.

Next, the oxide layer (not shown) on source/drain regions 56A and 56B is etched. Silicide layers 78 are then formed. In accordance with some embodiments of the present disclosure, a metal layer (not shown), which may be a titanium layer, a nickel layer, a cobalt layer, or the like, is deposited as a blanket layer. Next, an anneal (which may be rapid thermal anneal) is performed to react the bottom portion of the metal layer with the surface portions of source/drain regions 56 to form silicide layer 78. The unreacted portions of the metal layer may then be removed, resulting in the structure shown in FIGS. 19A and 19B. During these process steps, hard masks 68 and gate spacers 76 may be become thinner, as shown in FIG. 19A.

FIGS. 20A and 20B illustrate the formation of etch stop layer 80 and ILD 82. Etch stop layer 80 may be formed of silicon oxide, silicon nitride, silicon carbide, silicon oxynitride, silicon carbo-nitride, or the like, and may be formed using a deposition method such as CVD, ALD, or the like. ILD 82 may include a material selected from Phospho-Silicate Glass (PSG), Boro-Silicate Glass (GSG), Boron-doped Phospho-Silicate Glass (BPSG), Fluorine-doped Silicon Glass (FSG), TEOS oxide, or PECVD oxide (which may include $SiO_2$). ILD 82 may be formed using spin-on coating, FCVD, or the like, or formed using a deposition method such as PECVD or Low Pressure Chemical Vapor Deposition (LPCVD).

ILD 82 and etch stop layer 80 may be etched to form contact openings. The boundaries of the exemplary contact openings are represented using dashed lines 84. The etching may be performed using, for example, Reactive Ion Etch (RIE). Some portions of silicide layers 78 are exposed to the contact openings. In a subsequent step, source/drain contact plugs (not shown) are formed in the contact openings. The formation of the contact plugs may include forming a blanket barrier layer and a metal-containing material over the blanket barrier layer, and performing a planarization to remove excess portions of the blanket barrier layer and the metal-containing material. The barrier layer may be formed of a metal nitride such as titanium nitride or tantalum nitride. The metal-containing material may include tungsten.

Figure 21:
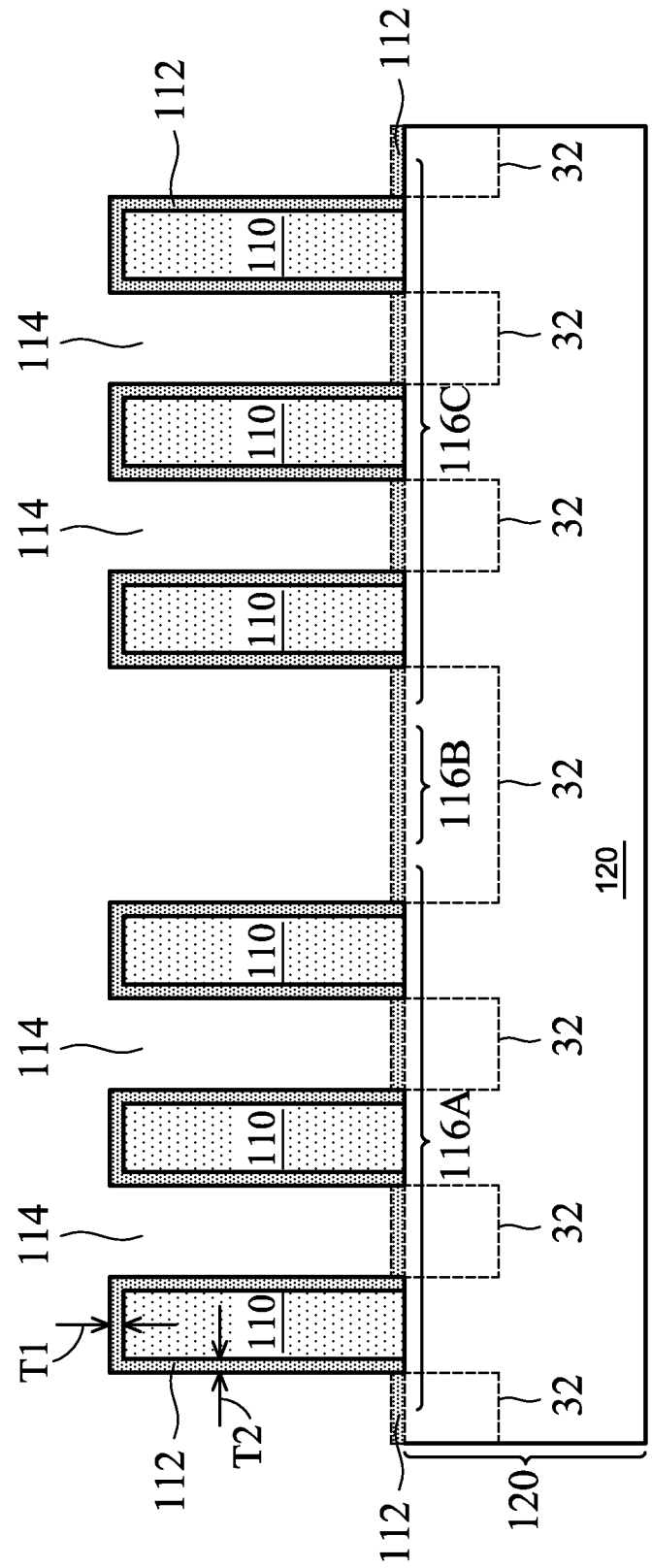
FIGS. 21 through 27 illustrate the cross-sectional views of intermediate stages in a gap-filling process in accordance with some embodiments.

FIGS. 21 through 27 illustrate the cross-sectional views of intermediate stages in a gap-filling process, in which a semiconductor material (such as silicon or silicon germanium) is filled into trenches in accordance with some embodiments. The respective process flow is shown as flow 500 in FIG. 29. FIG. 21 illustrates strips 110 protruding higher than the top surface of base structure 120. Strips 110, when viewed from top, are elongated strips, and the plane shown in FIG. 21 is perpendicular to the lengthwise directions of strips 110. Dielectric layer 112 is formed on the sidewalls and the top surfaces of strips 110 in accordance with some embodiments. Dielectric layer 112 may be formed as a conformal layer, and the thickness T1 of the horizontal portions and thickness T2 of the vertical portions are close to each other, for example, with a difference smaller than about 20 percent of thickness T1. Dielectric layer 112 may or may not include horizontal portions on top of base structure 120, and hence these portions of dielectric layer 112 are illustrated using dashed lines to indicate they may or may not exist. Trenches 114 are between strips 110. In accordance with some embodiments of the present disclosure, the aspect ratio (the ratio of depth to width) of trenches 114 is greater than 5, and may be in the range between about 5 and about 18.

Figure 25:
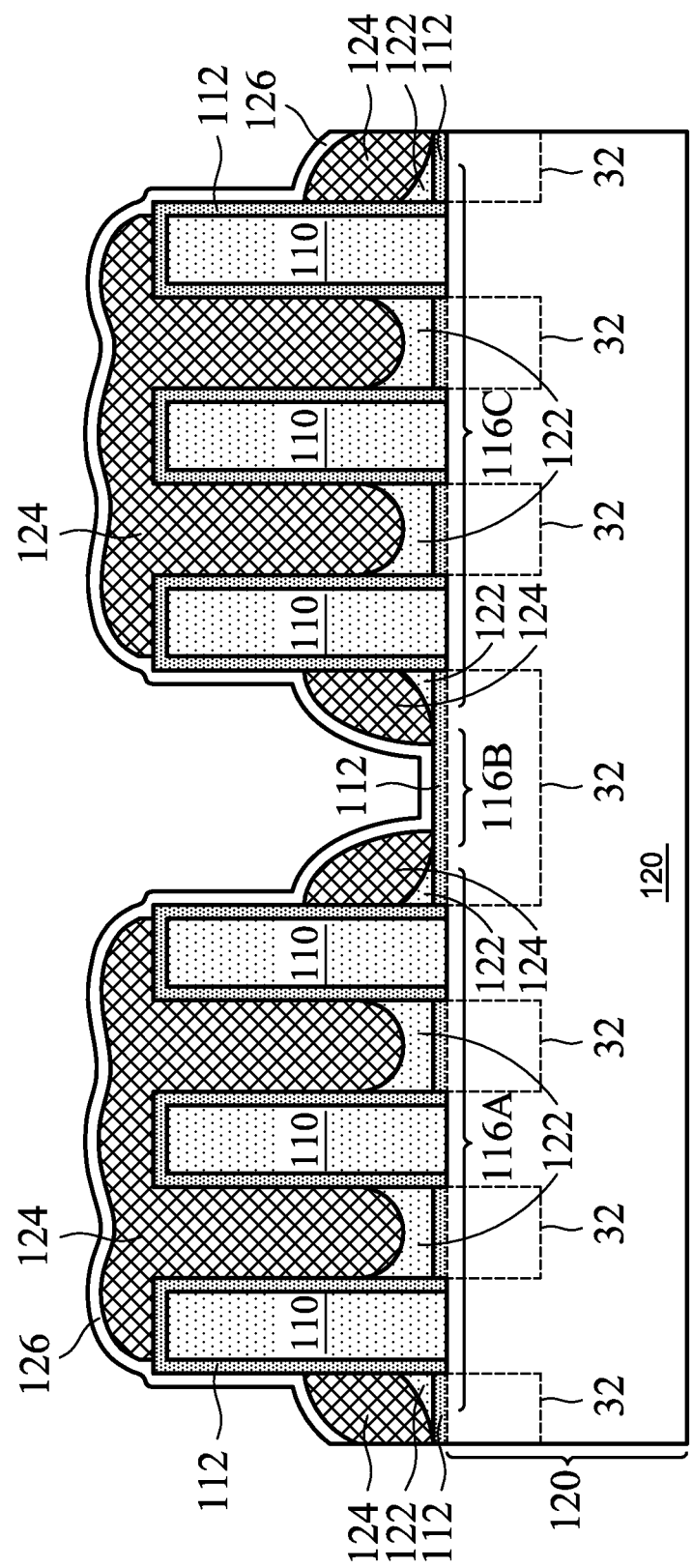
Figure 26:
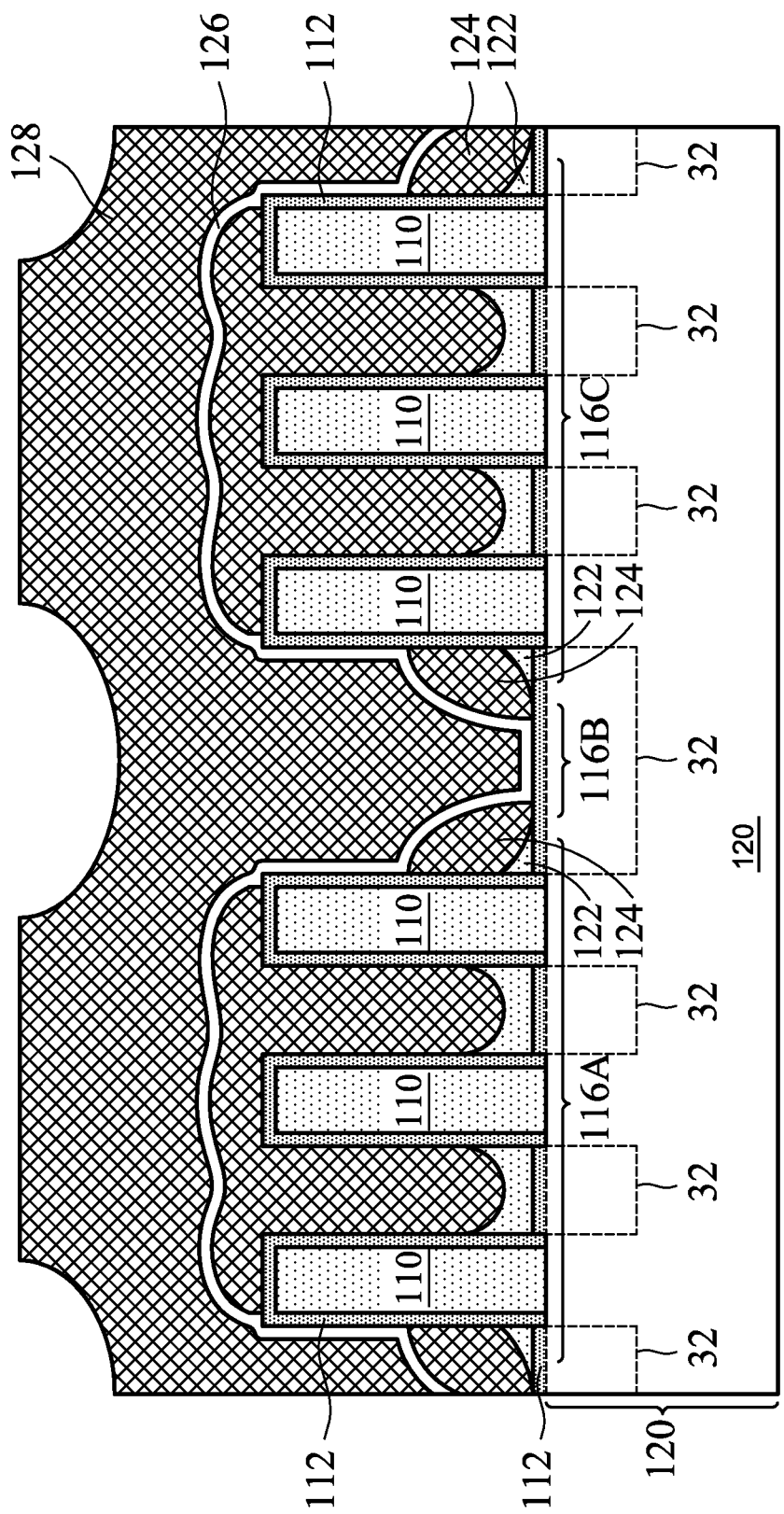
Figure 27:
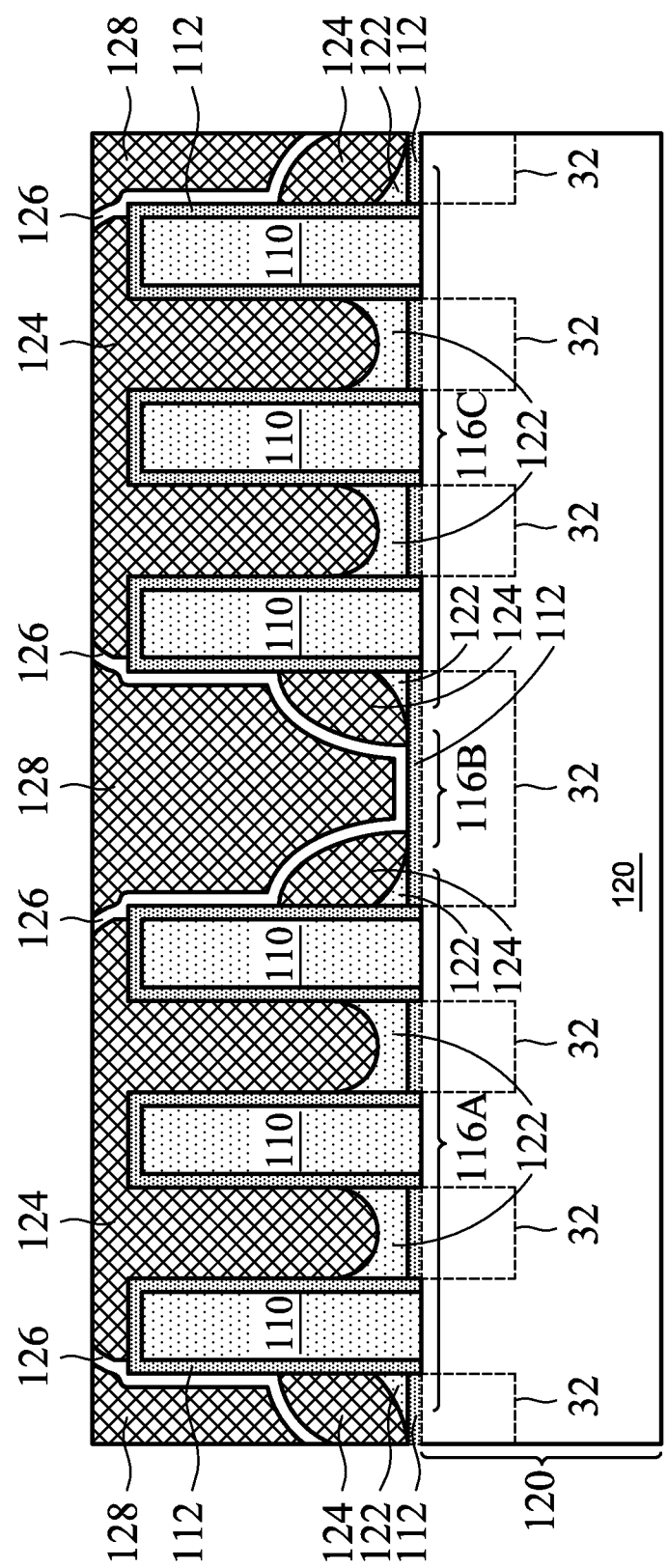

In accordance with some embodiments of the present disclosure, the gap-filling process as shown in FIGS. 21 through 27 is used to form dummy gate electrode layer 38 as shown in FIG. 7. Accordingly, the steps shown in FIGS. 21 through 27 correspond to step 408 in FIG. 28. Strips 110 in FIG. 21 correspond to semiconductor fins 34 in FIG. 7. Dielectric layer 112 corresponding to dummy gate dielectric 36 in FIG. 7. Base structure 120 correspond to STI regions 32, bulk substrate 20, and semiconductor strips 30 in FIG. 7. The resulting semiconductor materials 122, 124, 126, and 128 as shown in FIG. 27 in combination correspond to dummy gate electrode layer 38 in FIG. 7.

In accordance with alternative embodiments of the present disclosure, the gap-filling process as shown in FIGS. 21 through 27 is used to form semiconductor layer 60 as shown in FIGS. 11A and 11B. The process shown in FIGS. 21 through 27 thus corresponds to step 416 in FIG. 28. Accordingly, strips 110 in FIG. 21 correspond to gate stacks 50 and gate spacers 48 in FIG. 11A. Dielectric layer 112 corresponding to dielectric layer 58 as in FIG. 11A. Base structure 120 corresponds to fin 34 and substrate 20 as shown in FIG. 11A. The resulting semiconductor materials 122, 124, 126, and 128 as shown in FIG. 27 in combination correspond to semiconductor layer 60 in FIGS. 11A and 11B.

There are pattern-dense regions and pattern-sparse regions on the respective wafer. For example, referring to FIG. 21, a first plurality of strips 110 are closely located from each other to form pattern-dense region 116A, and a second plurality of strips 110 are closely located from each other to form pattern-dense region 116C. The strips 110 in pattern-dense region 116A are in combination referred to as a strip-group hereinafter. The strips 110 in pattern-dense region 116C are in combination referred to as a strip-group hereinafter. Between pattern-dense regions are pattern-sparse regions (such as region 116B). The pattern-sparse regions have lower density (or wider space between strips) of strips 110 than pattern-dense regions. It is appreciated that although FIG. 21 illustrates that there is no strip 110 in pattern-sparse region 116B, there may also exist some strips 110 (with wider space) in pattern-sparse regions.

Figure 22:
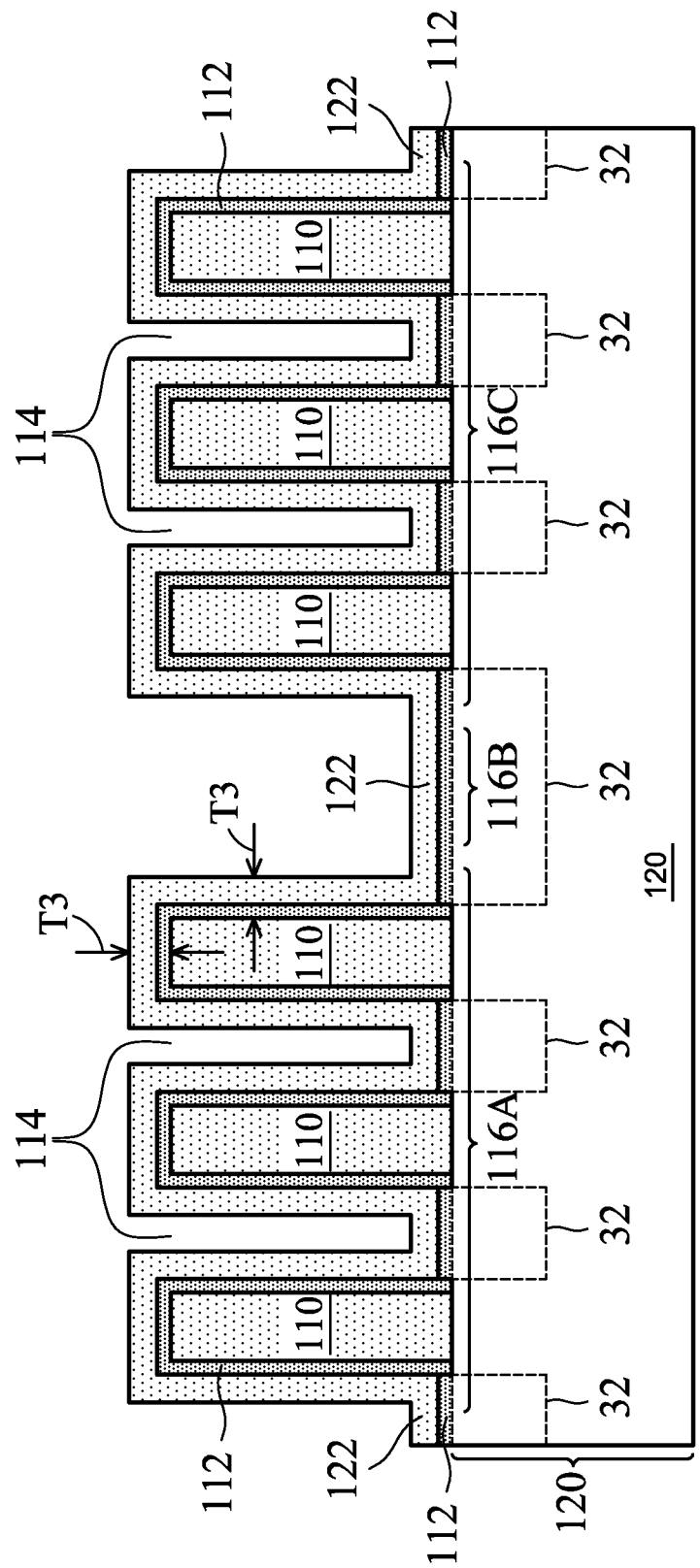
Figure 29:
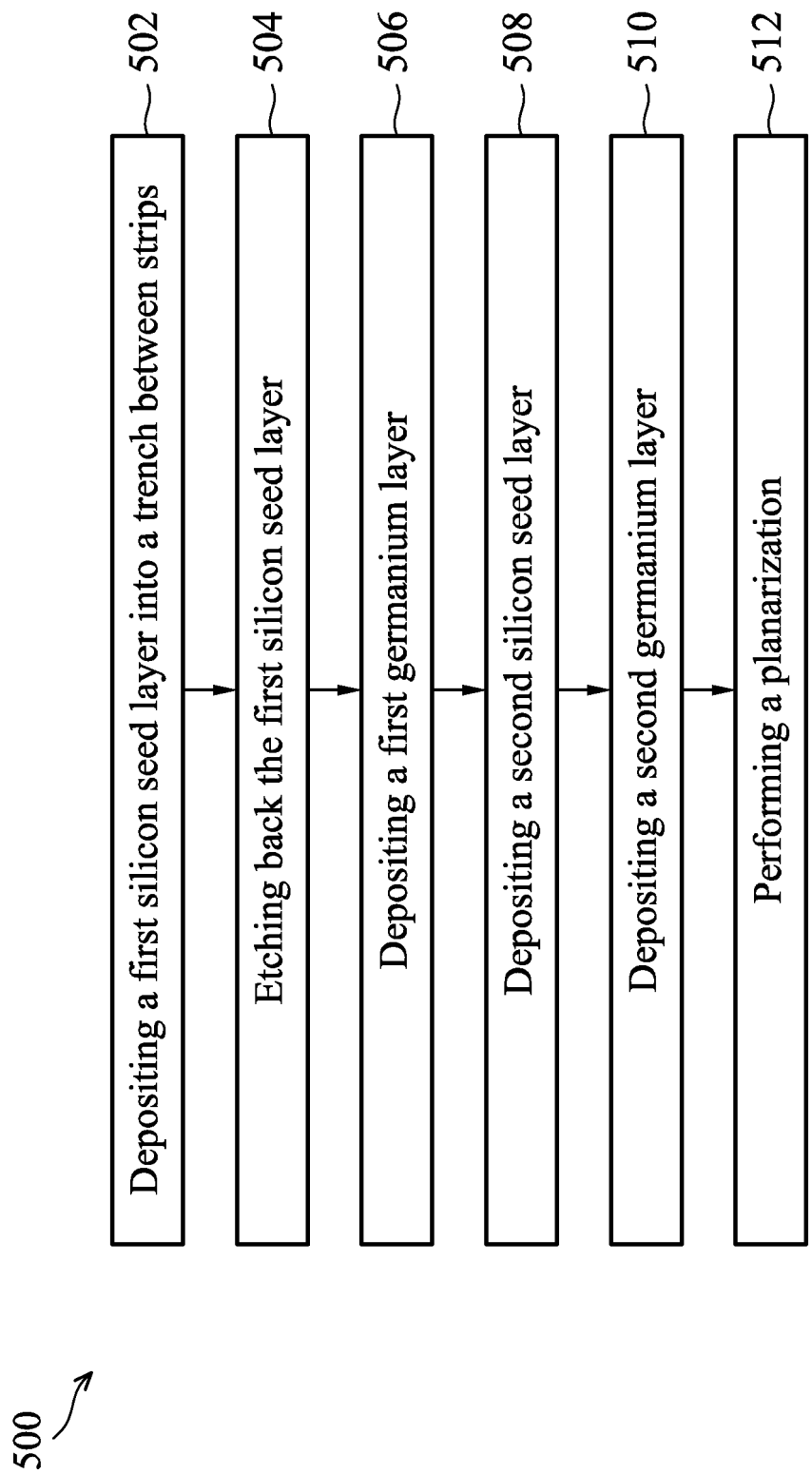
FIG. 29 illustrates a process flow of a gap-filling process in accordance with some embodiments.

Referring to FIG. 22, (a first) silicon seed layer 122 is deposited on the exposed dielectric material such as layer 112 or STI regions 32, which may be formed of silicon nitride, silicon oxide, combinations thereof, or the like. The respective step is illustrated as step 502 in the process flow 500 as shown in FIG. 29. In accordance with some embodiments of the present disclosure, silicon seed layer 122 is an amorphous silicon layer. In accordance with alternative embodiments, silicon seed layer 122 is a polysilicon layer, or may include some grains separated from each other by amorphous silicon.

Silicon seed layer 122 may be deposited using a conformal deposition method, which may be LPCVD, ALD, CVD, or the like. In accordance with some embodiments of the present disclosure, the silicon seed layer is deposited using a silicon-containing precursor such as $SiH_3-N((CH-CH_3)_2)_2$. Silicon seed layer 122 may be free from, or may include, other elements such as germanium, n-type impurities (such as phosphorous and arsenic), and p-type impurities (such as boron and indium). In accordance with some embodiments, after the formation of a bottom layer of silicon seed layer 122 using $SiH_3-N((CH-CH_3)_2)_2$, silicon seed layer 122 may be grown thicker on the formed thin bottom seed layer using a silicon-and-hydrogen-containing precursor, which may be expressed as $Si_xH_{2x+2}$ (with x being an integer equal to or greater than 1). For example, the precursor may include disilane ($Si_2H_6$), monosilane ($SiH_4$), or the mixture of disilane and monosilane. The temperature for growing the silicon layer using disilane may be in the range between about 350° C. and about 400° C. Depending on the temperature, the growth rate, and other process conditions, silicon seed layer 122 may be an amorphous silicon layer or a polysilicon layer. The thickness T3 of silicon seed layer 122 may be in the range between about 20 Å and about 200 Å. Silicon seed layer 122 may be formed as a conformal layer, and the thickness T3 of horizontal portions and vertical portions are close to each other, for example, with a difference smaller than about 20 percent.

It is relatively easy (compared to germanium) for silicon to incubate on some dielectric layers such as nitrides (silicon nitride, for example), oxides (such as silicon oxide), or other dielectric materials such as silicon oxynitride, silicon carbonitride, silicon oxy-carbo-nitride, or the like. For example, the incubation time (the time for silicon to start forming) on these material is shorter than about 50 minutes when the growth temperature is about 300° C. If higher temperature is used, the incubation time may be shortened. Accordingly, it is relatively easy to form the conformal silicon layer 122 on the structure shown in FIG. 21.

Figure 23:
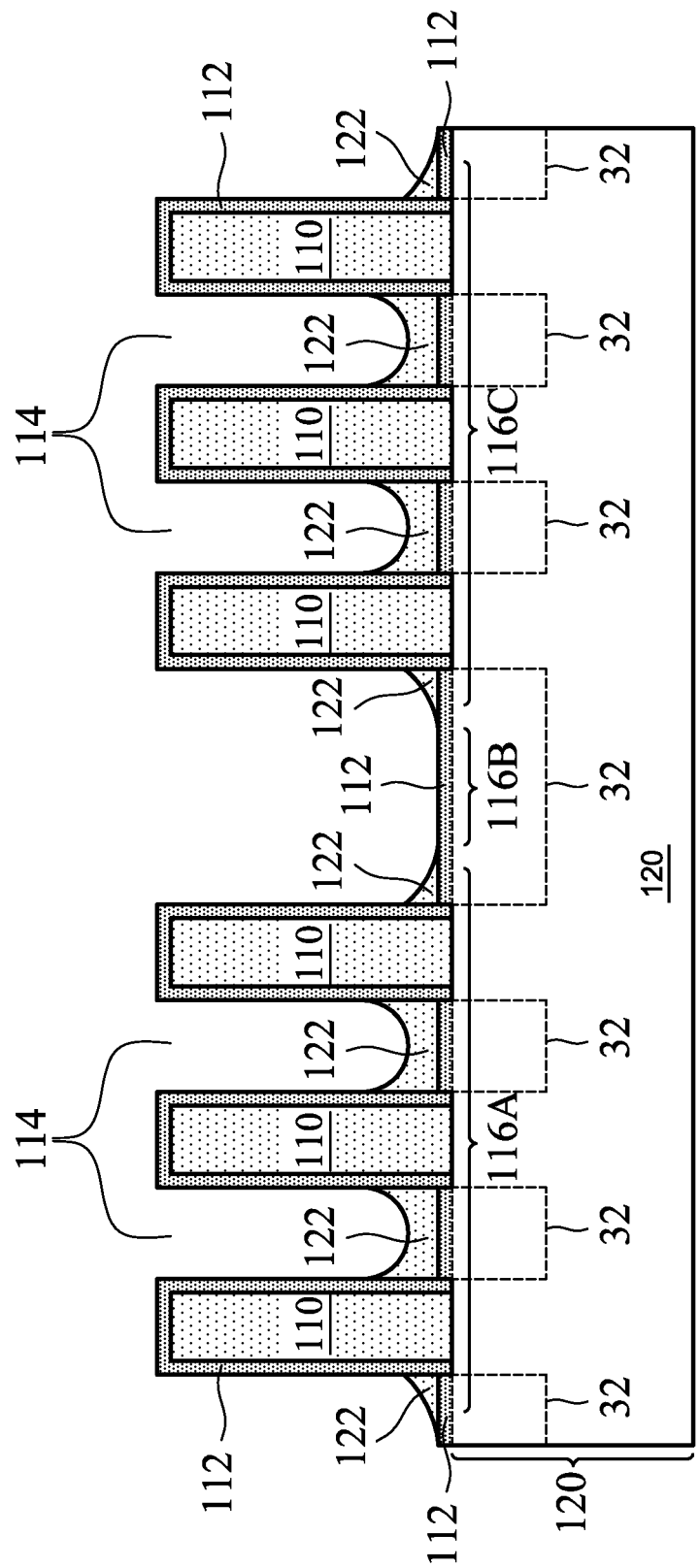

An etch-back is then performed on silicon seed layer 122, resulting in the structure shown in FIG. 23. The respective step is illustrated as step 504 in the process flow 500 as shown in FIG. 29. In accordance with some embodiments of the present disclosure, the etch-back is performed through dry etch, and an etching gas such as chlorine ($Cl_2$) is used. In accordance with other embodiments, other etching gases such as HCl may be used. In accordance with some embodiments of the present disclosure, the etch-back is isotropic (for example, without applying bias power in the etching chamber during the etch-back). The etch-back may also be performed without using any etching mask to protect any portion of silicon seed layer 122.

In the etch-back, the portions of silicon seed layer 122 in pattern-sparse regions (such as 116B) are etched more than the portions of silicon seed layer 122 in pattern-dense regions such as 116A and 116C. Furthermore, the portions of silicon seed layer 122 on top of strips 110 are etched faster than the portions of silicon seed layer 122 in trenches 114. As a result, the portions of silicon seed layer 122 on top of strips 110 and in pattern-sparse region 116B may be removed, while some portions of silicon seed layer 122 at the bottom of trenches 114, or at the corners formed between strips 110 and base structure 120, may remain. Accordingly, the portions of dielectric layer 112 (or STI regions 32) on the top surfaces and top portions of the sidewalls of strips 110 are exposed again. Alternatively stated, between the strip group in pattern-dense region 116A and the strip group in pattern-dense region 116C, dielectric material (silicon nitride, silicon oxide, or other dielectric materials) may be revealed again.

Figure 24:
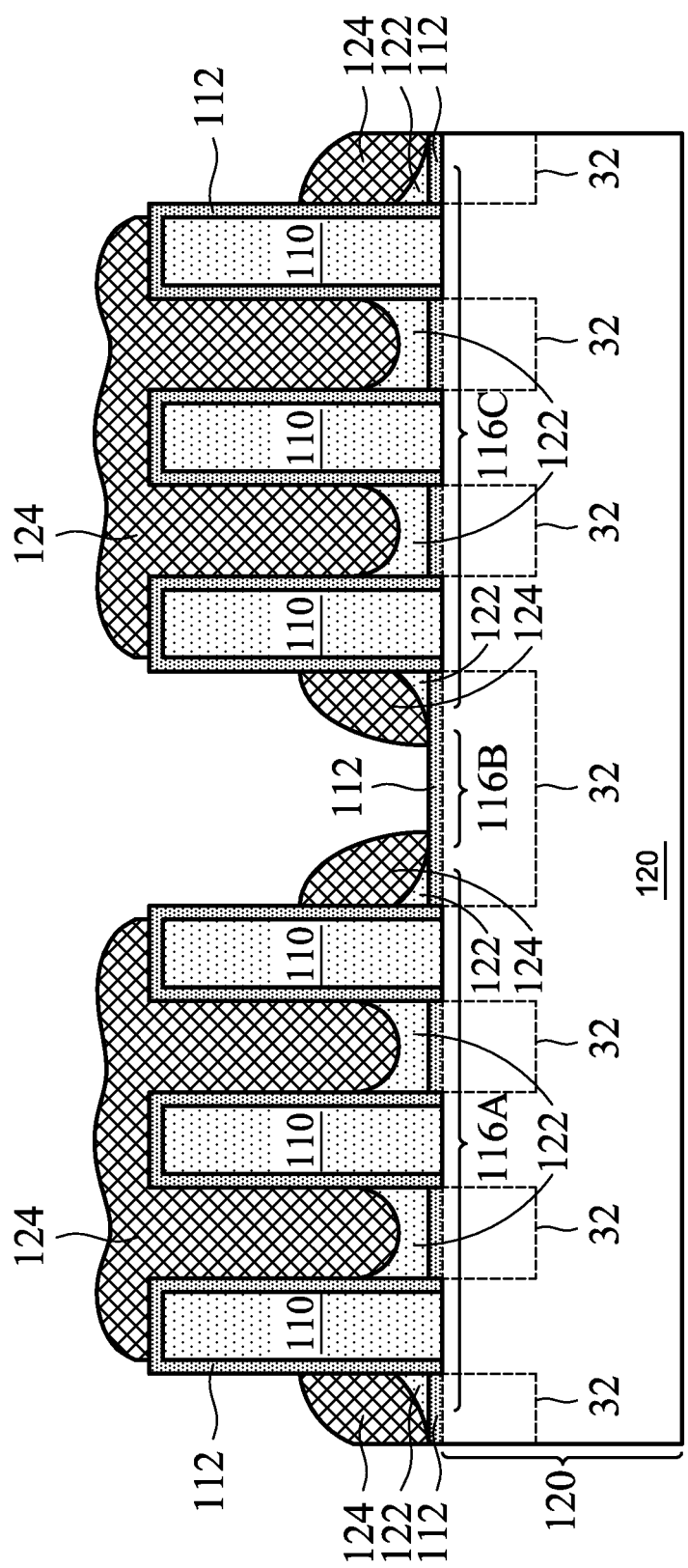

FIG. 24 illustrates the growth of (first) germanium layer(s) 124 in accordance with some embodiments of the present disclosure. The respective step is illustrated as step 506 in the process flow 500 as shown in FIG. 29. In accordance with some embodiments of the present disclosure, the precursor includes a germanium-and-hydrogen containing precursor, which may be expressed as $Ge_xH_{2x+2}$ (with x being an integer equal to or greater than 1). For example, the precursor may include digermane ($Ge_2H_6$), monogermane ($GeH_4$), or the mixture of digermane and monogermane. Germanium layers 124 may be free from silicon therein, or may include a small amount of silicon, for example, less than about 10 atomic percent, 5 atomic percent, or 1 atomic percent. As a result, germanium layers 124 may include silicon germanium. The precursors are thus adjusted to form the desirable germanium layers 124.

The structure as shown in FIG. 23 includes the exposed surfaces of silicon seed layer 122, and the exposed surfaces of other materials such as dielectric layer 112 and/or STI regions 32, etc. Accordingly, in the formation of germanium layers 124, process conditions are adjusted, so that germanium layers 124 are grown from silicon seed layer 122, and not from the exposed surfaces of other materials such as dielectric layer 112 and STI regions 32. In accordance with some embodiments of the present disclosure, the selective growth is achieved utilizing the difference between the incubation time of germanium on silicon and the incubation time of germanium on other materials such as silicon nitride and silicon oxide, etc. For example, the incubation time of germanium on silicon at 300° C. is shorter than about 50 minutes, while the incubation time of germanium on silicon nitride and silicon oxide at 300° C. is longer than about 150 minutes. Accordingly, for growing germanium layers 124, the temperature of the respective wafer may be lower than about 350° C., and may be in the range between about 250° C. and about 350° C., so that during the growth time, germanium substantially does not incubate on the exposed surfaces of dielectric layers such as layer 112 and STI regions 32 (if exposed). On the other hand, during the growth time, germanium incubates on silicon seed layer 122, and then start growing on the formed germanium layer.

As shown in FIG. 24, germanium layers 124 grow from silicon seed layer 122 with a bottom-up style, and eventually may fully fill the trenches 114 (FIG. 23) in pattern-dense regions 116A and 116C. The portions of germanium layers 124 grown from neighboring trenches 114 (refer to FIG. 23) may grow laterally to merge with each other, or may be separated from each other. On the other hand, in the pattern-sparse region 116B, since germanium does not incubate on the exposed surfaces of dielectric layer 112 or STI regions 32, dielectric layer 112 or STI regions 32 may remain exposed. Furthermore, although germanium layers 124 grow laterally when spaces are available, the growth is not adequate to fill pattern-sparse region 116B. The sidewall portions of dielectric layers 112 facing pattern-sparse region 116B may also be exposed after the formation of germanium layers 124.

As shown in FIGS. 23 and 24 and discussed in preceding paragraphs, if silicon seed layer 122 is not formed, it is difficult to form germanium layers 124 due to the difficulty in the incubation of germanium. The formation of patterned silicon layer 122 in combination with the difficulty of growing germanium directly from layer 112/32 achieve the bottom-up growth of germanium, and hence trenches 114 may be filled without generating seams and voids. Furthermore, the bottom-up growth significantly reduces the bending of strips 110 due to the support of the lower parts of strips 110. This is different from using conventional gap-filling methods in which non-bottom-up (such as conformal) deposition methods, e.g. seams and voids and bending formed due to sidewall deposited film merged during the conformal deposition, are used.

Referring to FIG. 25, a second silicon seed layer 126 is deposited as a blanket layer. The respective step is illustrated as step 508 in the process flow 500 as shown in FIG. 29. Silicon seed layer 126 may be formed of similar materials as silicon seed layer 122. For example, silicon seed layer 126 may be an amorphous silicon layer, a polysilicon layer, or may include some grains separated from each other by amorphous silicon. Silicon seed layer 126 may be free from germanium. Furthermore, silicon seed layer 126 may include or may be free from n-type and/or p-type impurities. Alternatively, silicon seed layer 126 may include a small amount of germanium, and the germanium atomic percentage may be lower than about 10 atomic percent, lower than about 5 atomic percent, or lower than about 1 atomic percent. Furthermore, the process conditions and the precursors for forming silicon seed layer 126 may be selected from the candidate process conditions and precursors for forming silicon seed layer 122. The details are thus not repeated herein. Silicon layer 126 is deposited as a blanket layer on both germanium layers 124 and the exposed surfaces of other materials such as dielectric layer 112 and STI regions 32.

Silicon seed layer 126 may be deposited using a conformal deposition method, which may be LPCVD, ALD, CVD, or the like. The temperature for growing the silicon layer 126 using disilane may be in the range between about 350° C. and about 400° C. The thickness of silicon seed layer 126 may be in the range between about 10 Å and about 200 Å.

Referring to FIG. 26, without performing etch-back on silicon seed layer 126, germanium layer 128 is further grown on silicon seed layer 126. The respective step is illustrated as step 510 in the process flow 500 as shown in FIG. 29. Since germanium layer 128 is to fill the trench in pattern-sparse regions such as region 116B, silicon seed layer 126 may remain as being a blanket layer when germanium layer 128 is grown. Accordingly, germanium layer 128 fills the pattern-sparse regions.

Next, as also shown in FIG. 27, a planarization step such as CMP or mechanical grinding is performed to level the top surface of germanium layer 128, silicon seed layer 126, and germanium layer 124. The respective step is illustrated as step 512 in the process flow 500 as shown in FIG. 29. The process steps as shown in FIGS. 21 through 27 may be used to form either one or both of the dummy gate electrode layer 38 (FIG. 7) and semiconductor layer 60 (FIG. 11A/11B). For example, when dummy gate electrode layer 38 in FIG. 7 is to be formed, silicon layers 122 and 126 and germanium layers 124 and 128 in combination form dummy gate electrode layer 38. When semiconductor layer 60 in FIG. 11A/11B is to be formed, silicon layers 122 and 126 and germanium layers 124 and 128 in combination form semiconductor layer 60. The planarization may be stopped at various positions, such as before reaching silicon layer 126, or after some silicon layer 126 is exposed (as shown in FIG. 27). The planarization may also be stopped when strips 110 are exposed (similar to what is shown in FIGS. 13A and 13B). In which embodiments, strips 110 represent features 36, 46 and 40 as shown in FIGS. 13A and 13B. It is to be realized that the embodiments in FIGS. 21 through 27 may be used in any other gap filling of germanium other than the embodiments shown in FIGS. 7 and 11A/11B.

The embodiments of the present disclosure have some advantageous features. By utilizing the difference between the incubation time of silicon and the incubation time of germanium when silicon and germanium are grown on different materials, the trenches between strips may be filled with a bottom-up style without causing voids, seams, and bending. Experiments have been performed to perform gap-filling using a plurality of materials and a plurality of process conditions, and a plurality of samples has been formed. The experiment results revealed that the bending of strips in the samples formed in accordance with the embodiments of the present disclosure is the smallest among all of the samples.

In accordance with some embodiments of the present disclosure, a method includes depositing a first silicon layer on a plurality of strips, wherein trenches are between the plurality of strips; etching back the first silicon layer to remove top portions of the first silicon layer, and to expose some portions of the plurality of strips, wherein bottom portions of the first silicon layer at bottoms of trenches remain after the etching back; and selectively growing a first germanium layer, wherein the first germanium layer is selectively grown from remaining portions of the first silicon layer, and exposed portions of the plurality of strips remain exposed after the first germanium layer is selectively grown. In an embodiment, the first germanium layer is grown until one of the trenches between two neighboring ones of the plurality of strips is fully filled. In an embodiment, the plurality of strips comprises a plurality of dummy gate stacks, and the method further comprises: forming a dielectric layer on the plurality of dummy gate stacks, with the first silicon layer being deposited on the dielectric layer; and removing the first silicon layer. In an embodiment, the method further includes removing the plurality of dummy gate stacks to form recesses; and forming replacement gates in the recesses, with the first silicon layer and the first germanium layer removed after the replacement gates are formed. In an embodiment, the method further includes removing the dielectric layer. In an embodiment, the plurality of strips comprises a plurality of semiconductor fins, and the method further comprises forming a dummy gate dielectric layer on the plurality of semiconductor fins, with the first silicon layer being deposited on the dummy gate dielectric layer. In an embodiment, the method further includes patterning the first silicon layer, the first germanium layer, and the dummy gate dielectric layer to form a dummy gate stack. In an embodiment, the method further includes depositing a second silicon layer on the first germanium layer, wherein the second silicon layer contacts the exposed portions of the plurality of strips; and depositing a second germanium layer on the second silicon layer. In an embodiment, the method further includes performing a planarization, wherein in the planarization, the second germanium layer, the second silicon layer, and the first germanium layer are planarized.

In accordance with some embodiments of the present disclosure, a method includes forming source/drain regions based on a plurality of semiconductor fins, wherein the plurality of semiconductor fins is between a plurality of dummy gate stacks; forming a dielectric layer on the source/drain regions and the plurality of dummy gate stacks; depositing a first silicon layer on the dielectric layer; etching back the first silicon layer, with some portions of the first silicon layer remaining; growing a first germanium layer on the remaining portions of the first silicon layer; growing a second silicon layer on the first germanium layer; depositing a second germanium layer on the second silicon layer; performing a planarization to planarize the second germanium layer; replacing the plurality of dummy gate stacks with replacement gates; and removing the first silicon layer, the first germanium layer, the second silicon layer, and the second germanium layer. In an embodiment, in the planarization, the second silicon layer and the first germanium layer are also planarized. In an embodiment, the first germanium layer is selectively grown from remaining portions of the first silicon layer, and at both a starting time and an ending time when the first germanium layer is grown, some portions of dielectric layer are exposed. In an embodiment, the first silicon layer is free from germanium, and the first germanium layer is free from silicon. In an embodiment, the first germanium layer is grown until a trench between two neighboring ones of the plurality of dummy gate stacks is fully filled. In an embodiment, the first germanium layer is grown at a temperature between about 250° C. and about 350° C.

In accordance with some embodiments of the present disclosure, a method includes forming a first strip group comprising a first plurality of strips and a second strip group comprising a second plurality of strips, wherein the first plurality of strips has first trenches therebetween, and the second plurality of strips has second trenches therebetween, and the first strip group is neighboring the second strip group, with a space therebetween being wider than spaces between the first trenches and spaces between the second trenches; depositing a first silicon layer on the first plurality of strips and the second plurality of strips; etching back the first silicon layer, with portions of the first silicon layer remaining at bottoms of the first trenches and the second trenches; and selectively growing a first germanium layer on the remaining portions of the first silicon layer, wherein the first germanium layer fully fills the first trenches and the second trenches, and the space has a portion unfilled by the first germanium layer. In an embodiment, the method further includes depositing a second silicon layer on the first germanium layer; and depositing a second germanium layer on the second silicon layer, wherein the second germanium layer fully fills the space. In an embodiment, the method further includes performing a planarization to remove a portion of the second germanium layer, a portion of the second silicon layer, and a portion of the first germanium layer. In an embodiment, the method further includes, removing the first germanium layer and the first silicon layer. In an embodiment, after the selectively growing a first germanium layer, a dielectric layer underlying the space has a top surface exposed to the space.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a substrate;
   a first protruding feature and a second protruding feature protruding above the substrate, wherein the first protruding feature and the second protruding feature are semiconductor fins, and wherein the first protruding feature and the second protruding feature are spaced apart from each other;
   a first silicon region between the first protruding feature and the second protruding feature;
   a first germanium region having a portion over and contacting the first silicon region, wherein the first silicon region and the first germanium region are at a same level as the first protruding feature and the second protruding feature; and
   a dielectric layer comprising:
   a first sidewall portion on a sidewall of the first protruding feature, wherein the first sidewall portion is between and contacting the first protruding feature and a combined region, and wherein the combined region comprises the first silicon region and the first germanium region.

2. The structure of claim 1, wherein the dielectric layer further comprises a second sidewall portion on a sidewall of the second protruding feature, wherein the first silicon region comprises a first portion contacting the first sidewall portion of the dielectric layer, and a second portion contacting the second sidewall portion of the dielectric layer, and the first portion and the second portion of the first silicon region are spaced apart from each other.

3. The structure of claim 1 further comprising a second silicon region over and contacting the first germanium region, wherein the second silicon region further contacts the first sidewall portion of the dielectric layer.

4. The structure of claim 3 further comprising a second germanium region over and contacting the second silicon region.

5. The structure of claim 1, wherein the dielectric layer comprises a bottom portion overlapped by the first silicon region and the first germanium region.

6. The structure of claim 1, wherein the first protruding feature and the second protruding feature are gate stacks.

7. The structure of claim 1, wherein the substrate comprises a semiconductor material, and the first protruding feature and the second protruding feature are physically joined with the semiconductor material of the substrate.

8. A structure comprising:
   a base layer;
   a first fin, a second fin, a third fin, and a fourth fin protruding over a top surface of the base layer;
   a first silicon region;
   a first germanium region over and contacting the first silicon region, wherein the first silicon region and the first germanium region are between the first fin and the second fin;
   a second silicon region between the third fin and the fourth fin;
   a second germanium region over and contacting the second silicon region; and
   a silicon layer over and contacting the second germanium region, wherein the silicon layer comprises a portion extending between the third fin and the fourth fin, and wherein both of a first bottom of the silicon layer and a second bottom of the second silicon region are in contact with the top surface of the base layer.

9. The structure of claim 8, wherein an entirety of the silicon layer is outside of an entire space between the first fin and the second fin.

10. The structure of claim 9, wherein the first fin and the second fin have a first spacing, and the third fin and the fourth fin have a second spacing greater than the first spacing.

11. The structure of claim 8, wherein a bottom of the second germanium region is in contact with the top surface of the base layer.

12. The structure of claim 8 further comprising a third silicon region between the third fin and the fourth fin, wherein the second silicon region and the third silicon region are spaced apart from each other.

13. The structure of claim 12, wherein the second silicon region and the third silicon region are spaced apart from each other by the second germanium region.

14. The structure of claim 8, wherein the base layer comprises a dielectric material.

15. A structure comprising:
   a base layer;
   a first protruding feature and a second protruding feature over the base layer, wherein the first protruding feature and the second protruding feature are spaced apart from each other;
   a first silicon region between the first protruding feature and the second protruding feature, wherein the first silicon region comprises:
      a first portion at a first corner formed between a top surface of the base layer and a first sidewall of the first protruding feature; and
      a second portion at a second corner formed between the top surface of the base layer and a second sidewall of the second protruding feature, wherein the first portion and the second portion are spaced apart from each other in a cross-sectional view of the structure; and
   a first germanium region comprising:
      a third portion at the first corner; and
      a fourth portion at the second corner, wherein the third portion is separated from the fourth portion in the cross-sectional view of the structure.

16. The structure of claim 15, wherein both of the first portion of the first silicon region and the third portion of the first germanium region contact the base layer.

17. The structure of claim 15 further comprising a second silicon region comprising a lower portion separating the first portion from the second portion of the first silicon region.

18. The structure of claim 17, wherein the lower portion of the second silicon region further separates the third portion from the fourth portion of the first germanium region.

19. The structure of claim 15 further comprising a second germanium region comprising a lower portion separating the first portion from the second portion of the first silicon region.

20. The structure of claim 19, wherein the lower portion of the second germanium region further separates the third portion from the fourth portion of the first germanium region.

* * * * *